(12) United States Patent
Kim et al.

(10) Patent No.: US 8,427,898 B2
(45) Date of Patent: Apr. 23, 2013

(54) METHOD AND APPARATUS FOR PERFORMING MULTI-BLOCK ACCESS OPERATION IN NONVOLATILE MEMORY DEVICE

(75) Inventors: Chan Ho Kim, Seoul (KR); Dong Kyu Youn, Ansan-si (KR); Sang Won Hwang, Suwon-si (KR); Jin Yub Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 248 days.

(21) Appl. No.: 13/008,441

(22) Filed: Jan. 18, 2011

(65) Prior Publication Data

US 2011/0205797 A1    Aug. 25, 2011

(30) Foreign Application Priority Data

Feb. 19, 2010  (KR) .................. 10-2010-0015313
Mar. 3, 2010   (KR) .................. 10-2010-0018883

(51) Int. Cl.
*G11C 8/00* (2006.01)

(52) U.S. Cl.
USPC ............. 365/230.03; 365/230.05; 365/230.06

(58) Field of Classification Search ............. 365/230.03, 365/51, 63, 230.06, 230.08, 230.05
See application file for complete search history.

(56) References Cited

U.S. PATENT DOCUMENTS

| | | | |
|---|---|---|---|
| 6,977,845 B2 | 12/2005 | Kawai | |
| 7,539,036 B2 | 5/2009 | Kishi | |
| 2007/0091707 A1* | 4/2007 | Hidaka | ..................... 365/230.03 |
| 2008/0094904 A1 | 4/2008 | Byeon | |
| 2008/0101119 A1 | 5/2008 | Park | |
| 2009/0016092 A1* | 1/2009 | Sato et al. | ........................ 365/51 |
| 2009/0147583 A1 | 6/2009 | Kim | |
| 2009/0168534 A1* | 7/2009 | Park et al. | ................ 365/185.17 |

FOREIGN PATENT DOCUMENTS

| | | |
|---|---|---|
| JP | 2005025819 A | 1/2005 |
| JP | 2007200512 A | 8/2007 |
| JP | 2009147304 A | 7/2009 |
| KR | 100449269 B1 | 9/2004 |
| KR | 1020050002624 A | 1/2005 |
| KR | 1020070078809 A | 8/2007 |
| KR | 100784007 B1 | 12/2007 |
| KR | 100822805 B1 | 4/2008 |
| KR | 1020090061344 A | 6/2009 |

* cited by examiner

*Primary Examiner* — Richard Elms
*Assistant Examiner* — Hien Nguyen
(74) *Attorney, Agent, or Firm* — Volentine & Whitt, PLLC

(57) ABSTRACT

A nonvolatile memory device comprises a first mat, a second mat, a third mat, a first address decoder, a second address decoder, and a third address decoder. The first mat comprises first memory blocks, the second mat comprises second memory blocks, and the third mat comprises third memory blocks. The first address decoder selects one of the first memory blocks according to a first even address, the second address decoder selects one of the second memory blocks according to a second even address or a first odd address, and the third address decoder selects one of the third memory blocks according to a second odd address.

20 Claims, 38 Drawing Sheets

Fig. 2
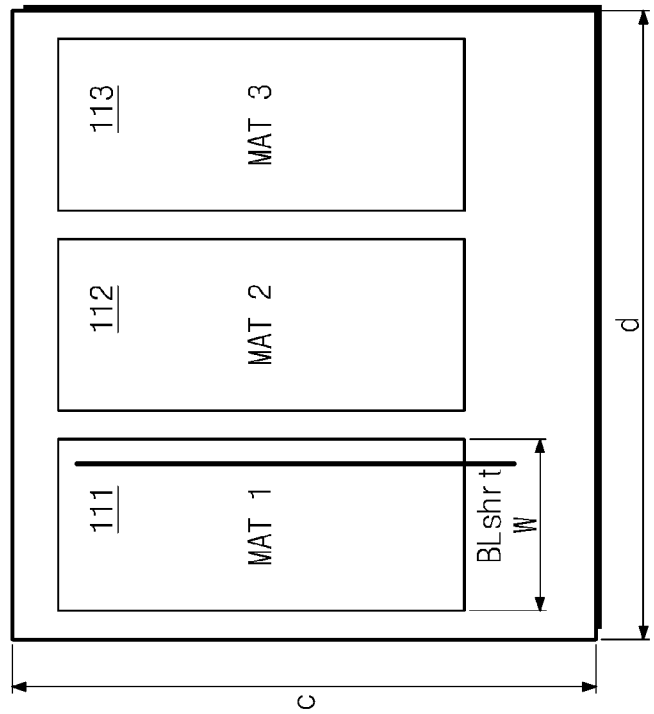
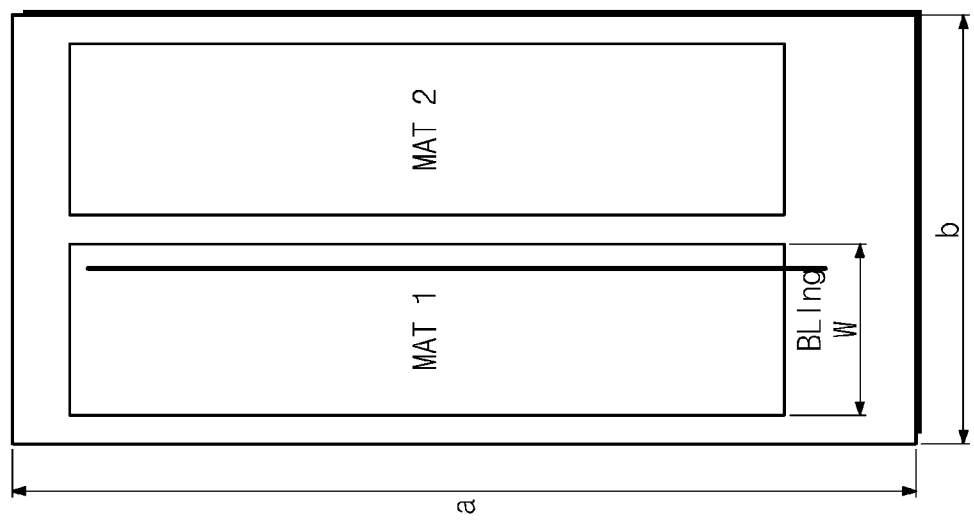

Fig. 5

| MAT 1(Even Block) | | | MAT 2(Even/Odd Block) | | MAT 3(Odd Block) |
|---|---|---|---|---|---|
| 111 | 121 | 122 | 112 | 123 | 113 |
| BLK 1366 | | | BLK 1367 | | BLK 1369 |
| BLK 1364 | | | BLK 1365 | | BLK 1371 |
| ⋮ | | | ⋮ | | ⋮ |
| BLK 2 | | | BLK 3 | | BLK 2733 |
| BLK 0 | X D E C 1 | X D E C 2 | BLK 1 | X D E C 3 | BLK 2735 |
| BLK 1368 | | | BLK 4094 | | BLK 4095 |
| BLK 1370 | | | BLK 4092 | | BLK 4093 |
| ⋮ | | | ⋮ | | ⋮ |
| BLK 2732 | | | BLK 2738 | | BLK 2739 |
| BLK 2734 | | | BLK 2736 | | BLK 2737 |
| | | | | | |

Fig. 6

| MAT 1(Even Block) | | | MAT 2(Odd Block) | | MAT 3(Even/Odd Block) |
|---|---|---|---|---|---|
| 111 | 121 | 122 | 112 | 123 | 113 |
| BLK 1366 | | | BLK 1369 | | BLK 1367 |
| BLK 1364 | | | BLK 1371 | | BLK 1365 |
| ⋮ | | | ⋮ | | ⋮ |
| BLK 2 | | | BLK 2733 | | BLK 3 |
| BLK 0 | X D E C 1 | X D E C 2 | BLK 2735 | X D E C 3 | BLK 1 |
| | | | | | |
| BLK 1368 | | | BLK 4095 | | BLK 4094 |
| BLK 1370 | | | BLK 4093 | | BLK 4092 |
| ⋮ | | | ⋮ | | ⋮ |
| BLK 2732 | | | BLK 2739 | | BLK 2738 |
| BLK 2734 | | | BLK 2737 | | BLK 2736 |
| | | | | | |

Fig. 7

| MAT 1(Odd Block) | | | MAT 2(Even/Odd Block) | | MAT 3(Even Block) |
|---|---|---|---|---|---|
| 111 | 121 | 122 | 112 | 123 | 113 |
| BLK 1367 | | | BLK 1366 | | BLK 1368 |
| BLK 1365 | | | BLK 1364 | | BLK 1370 |
| ⋮ | | | ⋮ | | ⋮ |
| BLK 3 | | | BLK 2 | | BLK 2732 |
| BLK 1 | X D E C 1 | X D E C 2 | BLK 0 | X D E C 3 | BLK 2734 |
|  | | |  | |  |
| BLK 1369 | | | BLK 4095 | | BLK 4094 |
| BLK 1371 | | | BLK 4093 | | BLK 4092 |
| ⋮ | | | ⋮ | | ⋮ |
| BLK 2733 | | | BLK 2739 | | BLK 2738 |
| BLK 2735 | | | BLK 2737 | | BLK 2736 |
|  | | |  | |  |

Fig. 8

| MAT 1(Odd Block) | | | MAT 2(Even Block) | | MAT 3(Even/Odd Block) |
|---|---|---|---|---|---|
| 111 | 121 | 122 | 112 | 123 | 113 |
| BLK 1367 | | | BLK 1368 | | BLK 1366 |
| BLK 1365 | | | BLK 1370 | | BLK 1364 |
| ⋮ | | | ⋮ | | ⋮ |
| BLK 3 | | | BLK 2732 | | BLK 2 |
| BLK 1 | X D E C 1 | X D E C 2 | BLK 2734 | X D E C 3 | BLK 0 |
| BLK 1369 | | | BLK 4094 | | BLK 4095 |
| BLK 1371 | | | BLK 4092 | | BLK 4093 |
| ⋮ | | | ⋮ | | ⋮ |
| BLK 2733 | | | BLK 2738 | | BLK 2739 |
| BLK 2735 | | | BLK 2736 | | BLK 2737 |

Fig. 9

| MAT 1(Even/Odd Block) | | | MAT 2(Even Block) | | MAT 3(Odd Block) |
|---|---|---|---|---|---|
| 111 | 121 | 122 | 112 | 123 | 113 |
| BLK 1367 | | | BLK 1366 | | BLK 1369 |
| BLK 1365 | | | BLK 1364 | | BLK 1371 |
| ⋮ | | | ⋮ | | ⋮ |
| BLK 3 | X | X | BLK 2 | X | BLK 2733 |
| BLK 1 | D | D | BLK 0 | D | BLK 2735 |
|  | E | E |  | E |  |
|  | C | C |  | C |  |
| BLK 4094 | 1 | 2 | BLK 1368 | 3 | BLK 4095 |
| BLK 4092 | | | BLK 1370 | | BLK 4093 |
| ⋮ | | | ⋮ | | ⋮ |
| BLK 2738 | | | BLK 2732 | | BLK 2739 |
| BLK 2736 | | | BLK 2734 | | BLK 2737 |
|  | | |  | |  |

Fig. 10

| MAT 1(Even/Odd Block) | | | MAT 2(Odd Block) | | MAT 3(Even Block) |
|---|---|---|---|---|---|
| 111 | 121 | 122 | 112 | 123 | 113 |
| BLK 1367 | | | BLK 1369 | | BLK 1366 |
| BLK 1365 | | | BLK 1371 | | BLK 1364 |
| ⋮ | | | ⋮ | | ⋮ |
| BLK 3 | | | BLK 2733 | | BLK 2 |
| BLK 1 | X D E C 1 | X D E C 2 | BLK 2735 | X D E C 3 | BLK 0 |
| | | | | | |
| BLK 4094 | | | BLK 4095 | | BLK 1368 |
| BLK 4092 | | | BLK 4093 | | BLK 1370 |
| ⋮ | | | ⋮ | | ⋮ |
| BLK 2738 | | | BLK 2739 | | BLK 2732 |
| BLK 2736 | | | BLK 2737 | | BLK 2734 |

Fig. 11

| 111 | 121 | 112 | 122 | 123 | 113 |
|---|---|---|---|---|---|
| MAT 1 | X D E C 1 | MAT 2 | X D E C 2 | X D E C 3 | MAT 3 |

Fig. 12

| 111 | 121 | 112 | 122 | 113 | 123 |
|---|---|---|---|---|---|
| MAT 1 | X D E C 1 | MAT 2 | X D E C 2 | MAT 3 | X D E C 3 |

Fig. 29

|  | MAT 1(Even Block) 111 | 121 | 122 | MAT 2(Even/Odd Block) 112 | 123 | MAT 3(Odd Block) 113 |
|---|---|---|---|---|---|---|
|  | BLK 1366 | | | BLK 1367 | | BLK 1369 |
|  | BLK 1364 | | | BLK 1365 | | BLK 1371 |
|  | ... | | | ... | | ... |
|  | BLK 2 | XDEC 1 | XDEC 2 | BLK 3 | XDEC 3 | BLK 2733 |
|  | BLK 0 | | | BLK 1 | | BLK 2735 |
|  | BLK 1368 | | | BLK 4094 | | BLK 4095 |
|  | BLK 1370 | | | BLK 4092 | | BLK 4093 |
|  | ... | | | ... | | ... |
|  | BLK 2732 | | | BLK 2738 | | BLK 2739 |
|  | BLK 2734 | | | BLK 2736 | | BLK 2737 |

Selected BLK Pair

METHOD AND APPARATUS FOR PERFORMING MULTI-BLOCK ACCESS OPERATION IN NONVOLATILE MEMORY DEVICE

CROSS-REFERENCE TO RELATED APPLICATIONS

This application claims priority under 35 U.S.C. §119 to Korean Patent Application No. 10-2010-0015313 filed on Feb. 19, 2010 and Korean Patent Application No. 10-2010-0018883 filed on Mar. 3, 2010, the respective disclosures of which are hereby incorporated by reference in their entirety.

BACKGROUND

Embodiments of the inventive concept relate generally to nonvolatile memory devices. More particularly, embodiments of the inventive concept relate to nonvolatile memory devices comprising a plurality of mats, and methods for performing multi-block access operations in the nonvolatile memory devices.

Semiconductor memory devices play a significant role in a wide variety of consumer and industrial technologies ranging from home computers to satellite equipment. Consequently, improvements in semiconductor memory technology can have a significant impact on the performance of numerous technical applications.

Semiconductor memory devices can be roughly divided into two categories based on whether they retain stored data when disconnected from power. These categories include volatile memory devices, which lose stored data when disconnected from power, and nonvolatile memory devices, which retain stored data when disconnected from power. Examples of volatile memory devices include dynamic random access memory (DRAM) and static random access memory (SRAM), and examples of nonvolatile memory devices include read only memory (ROM), ferroelectric random access memory (FRAM), phase-change random access memory (PRAM), and flash memory.

Flash memory has achieved widespread popularity in recent years due to its attractive cost, performance, storage capacity, and durability. As the demand for flash memory has continued to grow, researchers have made continual improvements to flash memory devices. Among these improvements is the development of flash memory devices that can store multiple bits of data per memory cell.

SUMMARY

Embodiments of the inventive concept provide nonvolatile memory devices having multiple mats each comprising a plurality of memory blocks. Embodiments of the inventive concept also provide methods of performing multi-block access operations in the multiple mats. Certain embodiments can reduce performance deterioration and read failures that can arise in the nonvolatile memory devices as they are formed with smaller sizes.

According to one embodiment of the inventive concept, a nonvolatile memory device comprises first through third mats and first through third address decoders. The first mat comprises first memory blocks each having an even address. The second mat comprises second memory blocks each having an even address or an odd address. The third mat comprises third memory blocks each having an odd address. The first address decoder selects one of the first memory blocks according to a first even address. The second address decoder that selects one of the second memory blocks according to a second even address or a first odd address. The third address decoder that selects one of the third memory blocks according to a second odd address.

In certain embodiments, the first, second, and third mats are formed in different wells. In certain embodiments, the first, second, and third mats share a plurality of bit lines and one well.

In certain embodiments, the respective first, second, and third memory blocks comprise vertical-type NAND strings formed in stacked semiconductor layers. In certain embodiments, the first even address and the second odd address differ only in their respective least significant bits.

According to another embodiment of the inventive concept, a method is provided for performing a multi-block access operation in a nonvolatile memory device comprising M mats, where M is an odd integer greater than or equal to three. The method comprises receiving an N-block access command and at least one address, where N is an integer between two and M, selecting N memory blocks from N mats according to the at least one address, and performing an N-block access operation on the selected memory blocks.

In certain embodiments, at least one of the M mats comprises one or more memory blocks having an even address and one or more memory blocks having an odd address. In certain embodiments, at least one of the M mats comprises only memory blocks having even addresses, and at least one of the M mats comprises only memory blocks having odd addresses.

In certain embodiments, the at least one address comprises N memory block addresses. In certain embodiments, the at least one address comprises a single memory block address. In certain embodiments, at least two of the selected memory blocks are selected using memory block addresses obtained by increasing or decreasing the one memory block address. In certain embodiments, two of the selected memory blocks have memory block addresses that differ only in their respective least significant bits. In certain embodiments, at least one of the selected memory blocks is selected using a memory block address obtained by adding a predetermined value to the one memory block address.

According to another embodiment of the inventive concept, a memory system comprises a nonvolatile memory device and a memory controller. The nonvolatile memory device comprises M mats each comprising a plurality of memory blocks, where M is an odd integer greater than or equal to three, and M address decoders each corresponding to a different one of the M mats and configured to select memory blocks from the corresponding mat according to an input address. The memory controller is configured to control the nonvolatile memory device to perform an N-block access operation in which at least two memory blocks from different mats are simultaneously selected according to one input address, wherein N is an integer between two and M.

In certain embodiments, during the N-block access operation, the M address decoders receive the one input address to select N memory blocks from N different mats among the M mats. In certain embodiments, the nonvolatile memory device comprises control logic that controls the address decoders to select the N memory blocks during the N-block access operation.

In certain embodiments, at least one of the M mats comprises one or more memory blocks having an even address and one or more memory blocks having an odd address. In certain embodiments, at least one of the M mats comprises only memory blocks having even addresses, and at least one of the M mats comprises only memory blocks having odd addresses. In certain embodiments, at least one of the M mats comprises only memory blocks having even addresses.

In certain embodiments, M equals three, and the respective mats are formed using process technology of 30 nm or less.

BRIEF DESCRIPTION OF THE DRAWINGS

The drawings illustrate selected embodiments of the inventive concept. In the drawings, like reference numbers indicate like features.

FIG. 2 is a diagram illustrating a relationship between different mat configurations of a nonvolatile memory device and the performance of the nonvolatile memory device.

FIGS. 5 through 10 are diagrams illustrating various example arrangements of memory block addresses for the mats shown in FIG. 1.

FIGS. 11 through 14 are diagrams illustrating various example arrangements of address decoders shown in FIG. 1.

FIG. 29 is a diagram illustrating groups of memory blocks that are selected concurrently in a three-block access operation using the memory block address configuration shown in FIG. 5.

DETAILED DESCRIPTION OF EMBODIMENTS

Embodiments of the inventive concept are described below with reference to the accompanying drawings. These embodiments are presented as teaching examples and should not be construed to limit the scope of the inventive concept.

Figure 1:
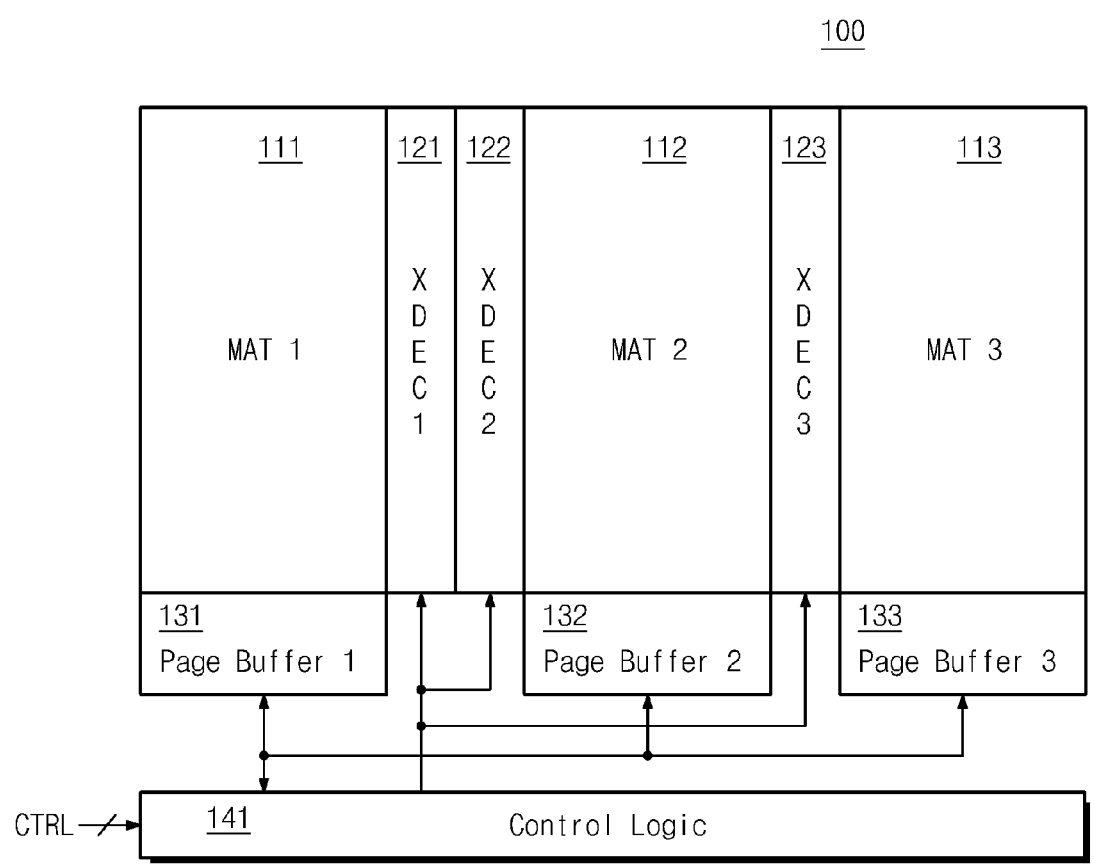
FIG. 1 is a diagram illustrating a nonvolatile memory device according to an embodiment of the inventive concept.

FIG. 1 is a diagram illustrating a nonvolatile memory device 100 according to an embodiment of the inventive concept. Referring to FIG. 1, nonvolatile memory device 100 comprises first through third mats 111 through 113, first through third address decoders 121 through 123, first through third page buffers 131 through 133, and control logic 141. Each mat typically comprises a set of memory blocks sharing a plurality of bit lines and one well.

For convenience of explanation, it will be assumed that nonvolatile memory device 100 is a NAND flash memory device. However, nonvolatile memory device 100 can take other forms, such as a NOR flash memory device, a resistive random access memory (RRAM), a PRAM, a magnetoresistive random access memory (MRAM), an FRAM, or a spin transfer torque random access memory (STT-RAM). Nonvolatile memory device 100 can also have a three-dimensional array structure or a vertical NAND structure.

Each of mats 111, 112, and 113 comprises a plurality of memory blocks, and each of the respective memory blocks comprises a plurality of memory cells connected to word lines and bit lines. The plurality of memory cells each store N-bit data, where N is greater than or equal to 1.

At least one of mats 111, 112, and 113 comprises only memory blocks having odd-numbered addresses. Memory blocks having odd-numbered addresses will be referred to as odd blocks, and memory blocks having even-numbered addresses will be referred to as even blocks. A mat that comprises only odd memory blocks will be referred to as an odd mat, and a mat that comprises only even memory blocks will be referred to as an even mat. At least one of mats 111, 112, and 113 comprises both odd blocks and even blocks.

The memory blocks of mats 111, 112, and 113 can be set to perform two-block or three-block access operations. In a two-block access operation, two memory blocks are selected and accessed in a single operation, and in a three-block access operation, three memory blocks are selected and accessed in a single operation. In both the two-block and three-block access operations, multiple memory blocks can be selected from different mats.

In a two-block access operation, two memory blocks can be selected by ignoring a least significant bit of an input address and selecting the two memory blocks based on the remaining bits of the input address. Alternatively, other techniques can be used to select two memory blocks. For instance, two memory blocks can be selected according to a value obtained by adding or subtracting 1 with the input address, or two memory blocks can be selected according to two memory block addresses.

In a three-block access operation, a memory block can be selected in each of mats 111, 112, and 113 according to one or more input addresses. Alternatively, more than one memory block can be selected in one of mats 111, 112, and 113. In some embodiments, a single input block address is used to select three memory blocks by ignoring a least significant bit of the input block address and selecting two memory blocks according to the remaining bits, and then selecting a third memory block by adding or subtracting a value from the input address to generate a third memory block address. Alternatively, other techniques can be used to select three memory blocks, such as providing two or three input addresses.

In the following description, it will be assumed that one, two, and three-block access operations are performed using a single input address. This assumption is made for simplicity of explanation.

Mats 111, 112, and 113 can be formed in the same wells or different wells.

Address decoders 121, 122, and 123 each receive and decode an input address, and then select one of a plurality of memory blocks according to the decoded input address. For example, in some embodiments, first address decoder 121 selects one memory block from the plurality of memory blocks included in first mat 111 according to the decoded input address, second address decoder 122 selects one memory block from the plurality of memory blocks included in second mat 112 according to the decoded input address, and third address decoder 123 selects one memory block from the plurality of memory blocks included in third mat 113 according to the decoded input address. In various alternative embodiments, the input address can be used to select one or more memory blocks from each of mats 111, 112, and 113.

During a multi-block access operation, address decoders 121, 122, and 123 select memory blocks as described below. In a normal access operation, one of address decoders 121, 122, and 123 selects one memory block according to the input address. During a two-block access operation, two of address decoders 121, 122, and 123 each select one or two memory blocks according to the input address. During a three-block access operation, address decoders 121, 122 and 123 each select one, two, or three memory blocks according to the input address.

First address decoder 121 is disposed at a right side of first mat 111, second address decoder 122 is disposed at a left side of second mat 112, and third address decoder 123 is disposed at a left side of third mat 113.

Page buffers 131, 132, and 133 are connected to respective mats 111, 112, and 113 through a plurality of bit lines. Page buffers 131, 132, and 133 temporarily store data to be programmed in memory cells corresponding to the input address, and temporarily store data read from memory cells of selected memory blocks corresponding to the input address.

Control logic 141 controls overall operations of nonvolatile memory device 100, such as program, read, and erase operations. Control logic 141 performs the program, read, and erase operations according to control signals CTRL provided from an external source.

Control logic 141 can control nonvolatile memory device 100 to selectively perform different types of multi-block access operations according to commands received from an external source. For instance, control logic 141 can control nonvolatile memory device 100 to perform a one-block, two-block, or three-block access operation according to different multi-block access commands.

In the two-block or three-block access operation, control logic 141 ignores a least significant bit of an input address and controls address decoders 121, 122, and 123 to select two memory blocks according to the remaining bits of the address. In the three-block access operation, control logic 141 controls address decoders 121, 122, and 123 to select an additional memory block according to a value obtained by adding a certain value to the input address. Nonvolatile memory device 100 can perform a two-block access operation even though it comprises three mats 111, 112, and 113.

FIG. 2 is a diagram illustrating a relationship between different mat configurations of a nonvolatile memory device and the performance of the nonvolatile memory device. As will be explained with reference to FIG. 2, certain mat configurations can reduce performance deterioration and read failures that can occur where the size of the nonvolatile memory device is decreased.

Referring to FIG. 2, a first memory chip has dimensions "a" and "b", and a second memory chip has dimensions "c" and "d". The first memory chip has two mats each having a width "W", and the second memory chip has two mats each having width "W". Accordingly, each of the mats can have the same number of memory cells connected to each word line.

The area "ab" of the first memory chip is the same as the area "cd" of the second memory chip. Moreover, the first and second memory chips are formed using the same process technology, which can be, for instance, sub-30 nm process technology.

The length of a bit line BLlng of the first memory chip is 1.5 times larger than the length of a bit line BLshrt of the second memory chip. The longer bit line BLlng has a greater resistance than the shorter bit line BLshrt. In general, as the resistance of a bit line increases, its performance decreases. Accordingly, in the example of FIG. 2, the mat configuration of the second memory chip may provide reduced performance deterioration and read errors compared with the mat configuration of the first memory chip. Consequently, nonvolatile memory device 100 is implemented with three mats 111, 112, and 113 to reduce performance deterioration and improve read performance in a limited area.

Figure 3:
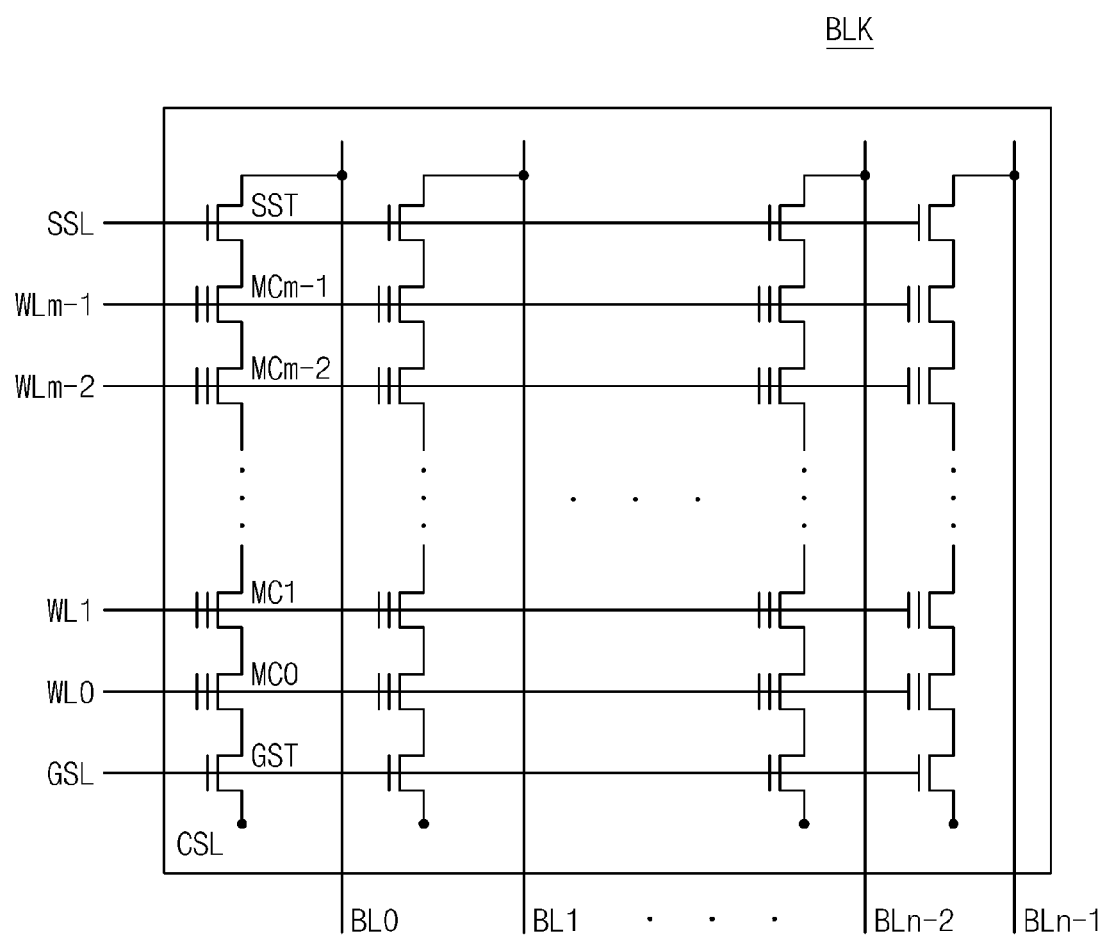
FIGS. 3 and 4 are diagrams illustrating various example configurations of memory blocks included in mats shown in FIG. 1.

FIG. 3 is a diagram illustrating an example configuration of a memory block included in the mats shown in FIG. 1. In the configuration of FIG. 3, memory block BLK comprises a plurality of memory cells formed at intersections of word lines WL0 through WLm-1 and bit lines BL0 through BLn-1, where m and n are natural numbers. Memory block BLK comprises a plurality of pages, where each page comprises a plurality of memory cells connected to a corresponding word line. Nonvolatile memory device 100 performs erase operations in units of a memory block, and performs read and write operations in units of a page.

Each of the memory cells in memory block BLK stores one or more bits of data. A memory cell capable of storing one bit is referred to as a single level cell (SLC), and a memory cell capable of storing two or more bits of data is referred to as a multi-level cell (MLC).

The memory cells of memory block BLK are organized in a plurality of cell strings, where each cell string comprises a string selection transistor SST connected to a string selection line SSL, a plurality of memory cells MC0 to MCm-1 connected to word lines WL0 through WLm-1, respectively, and a ground selection transistor GST connected to a ground selection line GSL. String selection transistor SST is connected between a bit line and a string channel, and ground selection transistor GST is connected between the string channel and a common source line CSL.

Memory block BLK can be formed in one semiconductor layer, but embodiments of the inventive concept are not limited thereto. For example, memory block BLK could alternatively be formed in two or more stacked semiconductor layers.

Figure 4:
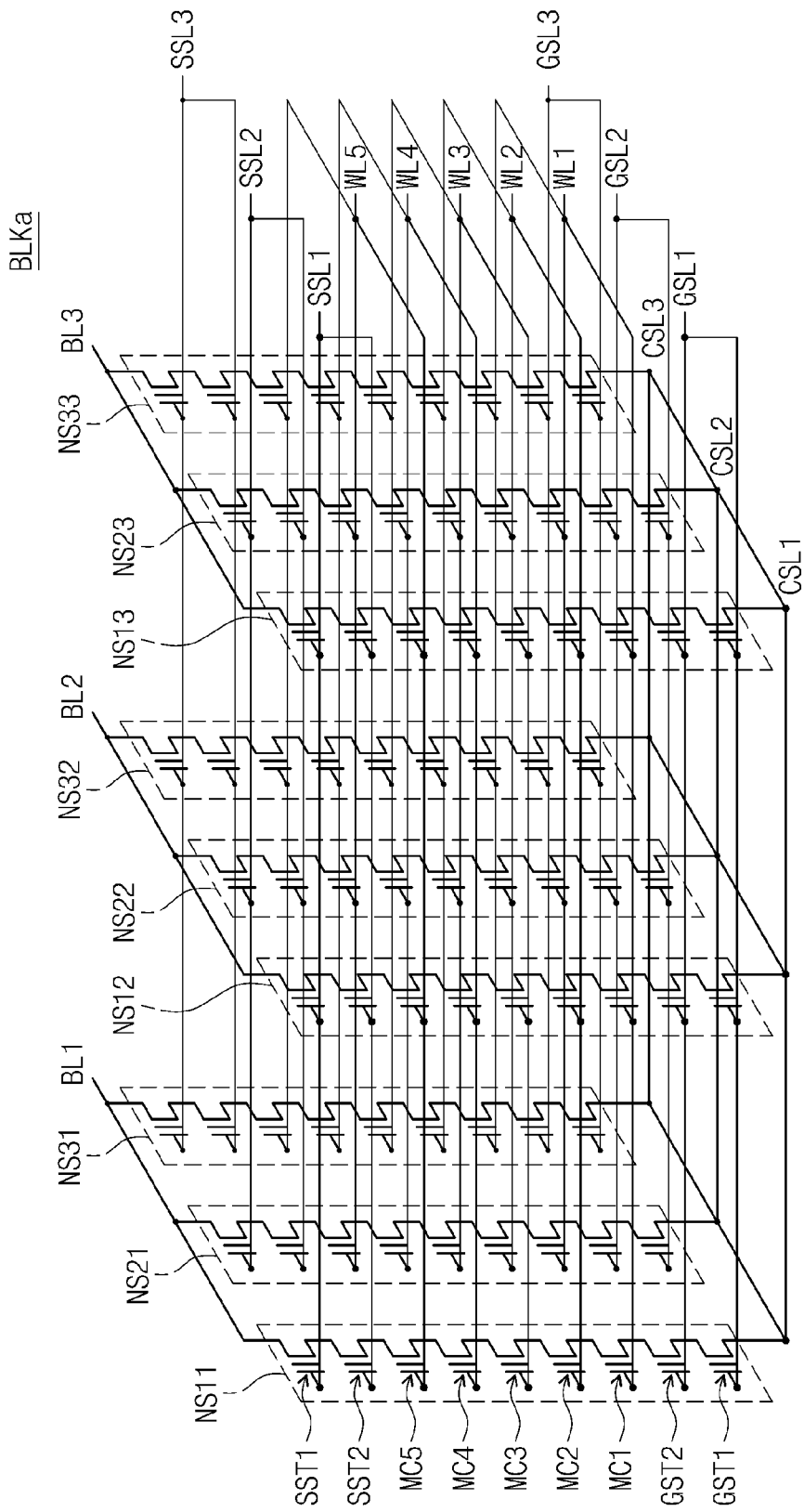

FIG. 4 is a diagram illustrating another example memory block configuration for the mats shown in FIG. 1. In the example of FIG. 4, the memory block is implemented in a three-dimensional memory device.

Referring to FIG. 4, a memory block BLKa comprises a plurality of NAND strings NS11 to NS13, NS21 through NS23, and NS31 through NS33 disposed in rows and columns. Each NAND string comprises at least one pair of string selection transistors SST1 and SST2, a plurality of memory cells MC1 through MC5, and at least one pair of ground selection transistors GST1 and GST2. Memory cells MC1 through MC5 are disposed in different layers of a device structure.

A first bit line BL1 is commonly connected to sides of NAND strings NS11, NS21, and NS31, a second bit line BL2 is commonly connected to sides of NAND strings NS12, NS22, and NS32, and a third bit line BL3 is commonly connected to sides of NAND strings NS13, NS23, and NS33.

A common source line CSL is commonly connected to other sides of NAND strings NS11 through NS13, NS21 through NS23, and NS31 through NS33 opposite first through third bit lines BL1, BL2, and BL3.

Word lines WL0, WL1, ..., WL5 are commonly connected to memory cells that are disposed on the same layer.

A first string selection line SSL1 is commonly connected to string selection transistors SST1 and SST2 of NAND strings NS11, NS12, and NS13 that are disposed in a first row. A second string selection line SSL2 is commonly connected to string selection transistors SST1 and SST2 of NAND strings NS21, NS22, and NS23 that are disposed in a second row. A third string selection line SSL3 is commonly connected to string selection transistors SST1 and SST2 of NAND strings NS31, NS32, and NS33 that are disposed in a third row.

A first ground selection line GSL1 is commonly connected to ground selection transistors GST1 and GST2 of NAND strings NS11, NS12, and NS13 that are disposed in the first row. A second ground selection line GSL2 is commonly connected to ground selection transistors GST1 and GST2 of NAND strings NS21, NS22, and NS23 that are disposed in the second row. A third ground selection line GSL3 is commonly connected to ground selection transistors GST1 and GST2 of NAND strings NS31, NS32, and NS33 that are disposed in the third row.

The number of NAND strings NS11 through NS13, NS21 through NS23, and NS31 through NS33, the number of word lines WL1 to WL5, and the number of bit lines BL1 to BL3 are shown as an example and can be varied in other embodiments.

In a program operation of memory block BLKa, 0V is applied to one of bit lines BL1, BL2, and BL3, and an operating voltage is applied to other bit lines for channel boosting. In addition, an operating voltage is applied to one of string selection lines SSL1, SSL2, and SSL3, and an off voltage is applied to other string selection lines. A program voltage is applied to a word line selected from word lines WL1 through WL5, and a pass voltage is applied to other word lines. Memory cells connected to both the bit line receiving 0V and the selected word line are injected with electric charges by F-N tunneling. As a result, one of NAND strings NS11 through NS13, NS21 through NS23, and NS31 through NS33 is selectively operated in the program operation. Here, the one NAND string that is selectively operated is commonly connected to the selected bit line and the selected string selection line.

In a read operation of memory block BLKa, a read voltage is applied to one of bit lines BL1, BL2, and BL3, and other bit lines are electrically floated. In addition, an operating voltage is applied to one of string selection lines SSL1, SSL2, and SSL3, and an off voltage is applied to other string selection lines. Thus, one of NAND strings NS 11 through NS 13, NS21 through NS23, and NS31 through NS33 is selectively operated in the read operation. The one NAND string that is selectively operated is commonly connected to the selected bit line and the selected string selection line.

In an erase operation of memory block BLKa, an erase voltage is applied to a bulk of memory cells MC1 through MC5, and 0V is applied to word lines WL0, WL1, ..., WL5.

Thus, data of memory cells MC of NAND strings NS11, NS12, NS21, and NS22 are erased at the same time.

In various alternative embodiments, one of string selection transistors SST1 and SST2 can be omitted, and one of ground selection transistors GST1 and GST2 can be omitted.

FIGS. 5 through 10 are diagrams illustrating various arrangements of even blocks and odd blocks in first through third mats 111, 112, and 113 of FIG. 1. Throughout the drawings, memory blocks are labeled with numbers that correspond to their respective memory block addresses.

In the example of FIG. 5, first mat 111 comprises only even blocks, second mat 112 comprises even and odd blocks, and third mat 113 comprises only odd blocks.

Referring to FIG. 5, first mat 111 comprises even blocks BLK0, BLK2, ... BLK1366 having addresses that increase between the center and the top of first mat 111, and 684 even blocks BLK1368, BLK1370, ..., BLK2734 having addresses that increase between the center to the bottom of first mat 111. In alternative embodiments, this address configuration can be varied. For example, the memory blocks of first mat 111 can be arranged with addresses that increase from the top of first mat 111, from the bottom of first mat 111, or a combination thereof. In addition, in alternative embodiments, first mat 111 can have a different number of memory blocks.

Although not shown in FIG. 5, a plurality of repair blocks can be disposed around the center of first mat 111. The repair blocks can be used to repair memory blocks BLK0, BLK2, ..., BLK2732, and BLK2734 of first mat 111. In addition, although not shown in FIG. 5, dummy blocks can be arranged around the top and bottom of first mat 111. The dummy blocks can be used to maintain a pattern of a fabrication process.

Second mat 112 comprises odd blocks BLK1, BLK3, ..., BLK1367 with addresses that increase from the center to the top of second mat 112, and even blocks BLK2736, BLK 2738, ..., BLK4094 with addresses that increase from the bottom to the center of first mat 112. In alternative embodiments, this address configuration can be varied. For instance, in alternative embodiments, odd blocks BLK1, BLK3, ... BLK1367 can be arranged with addresses that increase from the top to the center of second mat 112, while even blocks BLK2736, BLK2738, ..., BLK4094 can be arranged with addresses that increase from the center to the top of second mat 112. Similarly, odd blocks BLK1, BLK3, ... BLK1367 and even blocks BLK2736, BLK2738, ..., BLK4094 can be arranged with addresses that increase from the bottom to the top of second mat 112, or vice versa.

Although not shown in FIG. 5, a plurality of repair blocks can be disposed around the center of second mat 112, and a plurality of dummy blocks can be disposed around the top and bottom of second mat 112. In addition, although not shown in FIG. 5, at least one information data block can be disposed around the center of second mat 112 to store information for driving nonvolatile memory device 100. Moreover, in alternative embodiments, second mat 112 can have a different number of memory blocks.

Third mat 113 comprises odd blocks BLK1369, BLK 1371, ..., BLK2735 with addresses that increase from the top to the center of third mat 113, and odd blocks BLK2737, BLK2739, ..., BLK4095 with addresses that increase from the bottom to the center of third mat 113. In alternative embodiments, this address configuration can be varied. For example, odd blocks BLK1369, BLK1371, ..., BLK2735 can be arranged with addresses that increase from the center to the top of third mat 113, and odd blocks BLK2737, BLK2739, ..., BLK4095 can be arranged with addresses that increase from the center to the bottom of third mat 113. Also, odd blocks BLK1369, BLK1371, . . . , BLK4093, and BLK4095 can be arranged with addresses that increase sequentially from the bottom to the top of third mat 113, vice versa.

Although not shown in FIG. 5, a plurality of repair blocks can be disposed around the center of third mat 113, and a plurality of dummy blocks can be disposed around the top and bottom of third mat 113. In addition, at least one information data block can be disposed around the center of third mat 113 to store information for driving nonvolatile memory device 100. The data stored in the information data block of second mat 112 can be copied to the information data block of third mat 113.

First mat 111 comprises 1368 even blocks BLK0, BLK2, . . . , BLK2734, second mat 112 comprises 684 odd blocks BLK1, BLK3, . . . , BLK1367 and 680 even blocks BLK2736, BLK2738, . . . , BLK4094, and third mat 113 comprises 1364 odd blocks BLK1369, BLK1371, . . . , BLK4095. In total, first through third mats 111 through 113 comprise 4096 memory blocks.

The examples of FIGS. 6 through 10 are similar to the example of FIG. 5, except that the arrangement of memory block addresses has been altered in the examples of FIGS. 6 through 10. In the example of FIG. 6, first mat 111 comprises only even blocks, second mat 112 comprises only odd blocks, and third mat 113 comprises even and odd blocks. In the example of FIG. 7, first mat 111 comprises only odd blocks, second mat 112 comprises even and odd blocks, and third mat 113 comprises only even blocks. In the example of FIG. 8, first mat 111 comprises only odd blocks, second mat 112 comprises only even blocks, and third mat 113 comprises even and odd blocks. In the example of FIG. 9, first mat 111 comprises even and odd blocks, second mat 112 comprises only even blocks, and third mat 113 comprises only odd blocks. In the example of FIG. 10, first mat 111 comprises even and odd blocks, second mat 112 comprises only odd blocks, and third mat 113 comprises only even blocks.

Figure 13:
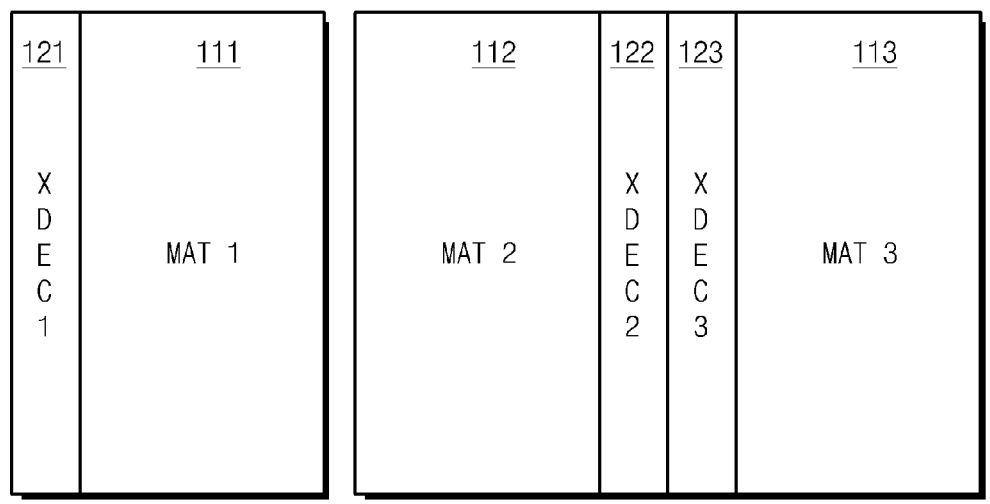
Figure 14:
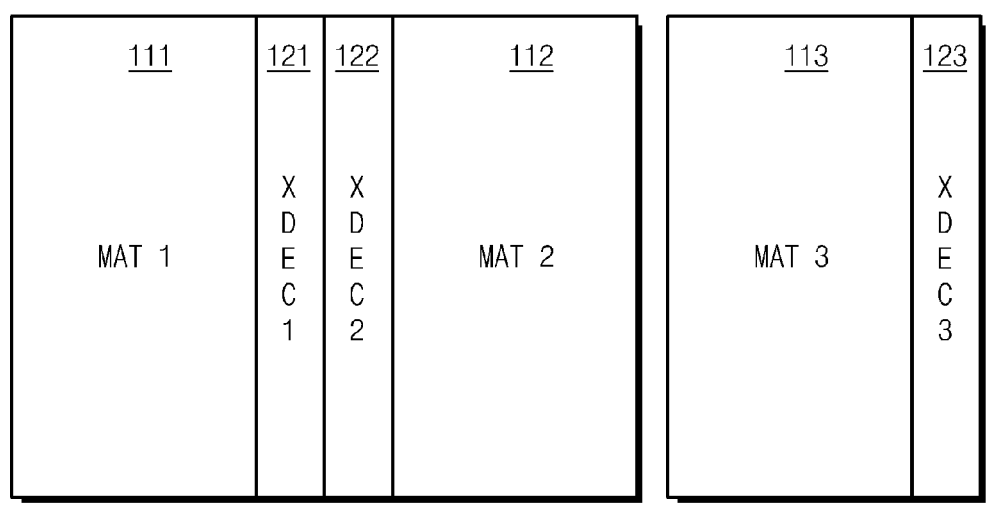

FIGS. 11 through 14 are diagrams illustrating various arrangements of first through third address decoders 121, 122 and 123. In the example of FIG. 11, first address decoder 121 is disposed at the right side of first mat 111, second address decoder 122 is disposed at the right side of second mat 112, and third address decoder 123 is disposed at the left side of a third mat 113. In the example of FIG. 12 first address decoder 121 is disposed at the right side of first mat 111, second address decoder 122 is disposed at the right side of second mat 112, and third address decoder 123 is disposed at the right side of third mat 113. In the example of FIG. 13, first address decoder 121 is disposed at the left side of first mat 111, second address decoder 122 is disposed at the right side of second mat 112, and third address decoder 123 is disposed at the left side of third mat 113. In the example of FIG. 14, first address decoder 121 is disposed at the right side of first mat 111, second address decoder 122 is disposed at the left side of second mat 112, and third address decoder 123 is disposed at the right side of third mat 113.

Nonvolatile memory device 100 shown in FIGS. 1 through 14 comprises three mats 111, 112, and 113. However, nonvolatile memory device 100 is not limited to three mats. For example, nonvolatile memory device 100 can have other numbers of mats, such as odd numbers greater than 3.

Figure 15:
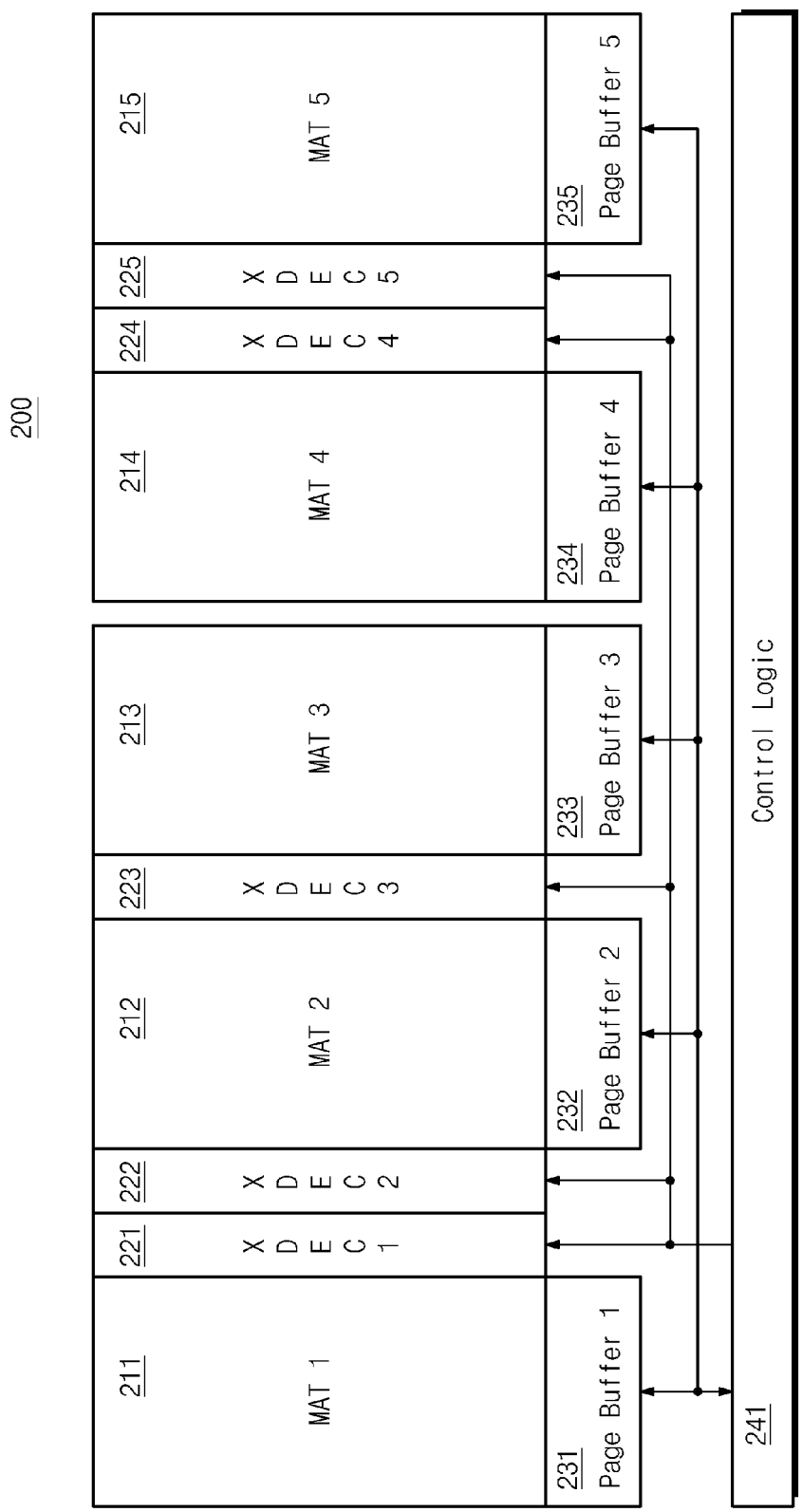
FIG. 15 is a diagram illustrating a nonvolatile memory device according to an embodiment of the inventive concept.

FIG. 15 is a diagram illustrating a nonvolatile memory device 200 according to an embodiment of the inventive concept.

Referring to FIG. 15, nonvolatile memory device 200 comprises five mats 211 through 215, five address decoders 221 through 225, five page buffers 231 through 235, and control logic 241. At least one of five mats 211 through 215 comprises even blocks and odd blocks.

First address decoder 221 is disposed at the right side of first mat 211, second address decoder 222 is disposed between first address decoder 221 and second mat 212, third address decoder 223 is disposed between second mat 212 and third mat 213, fourth address decoder 224 is disposed at the right side of fourth mat 214, and fifth address decoder 225 is disposed between fourth address decoder 224 and fifth mat 215. The arrangement of address decoders 221 through 225, however, is not limited to that of FIG. 15.

FIGS. 16 through 24 are diagrams illustrating various alternative arrangements of first through fifth address decoders 221 through 225.

Figure 16:
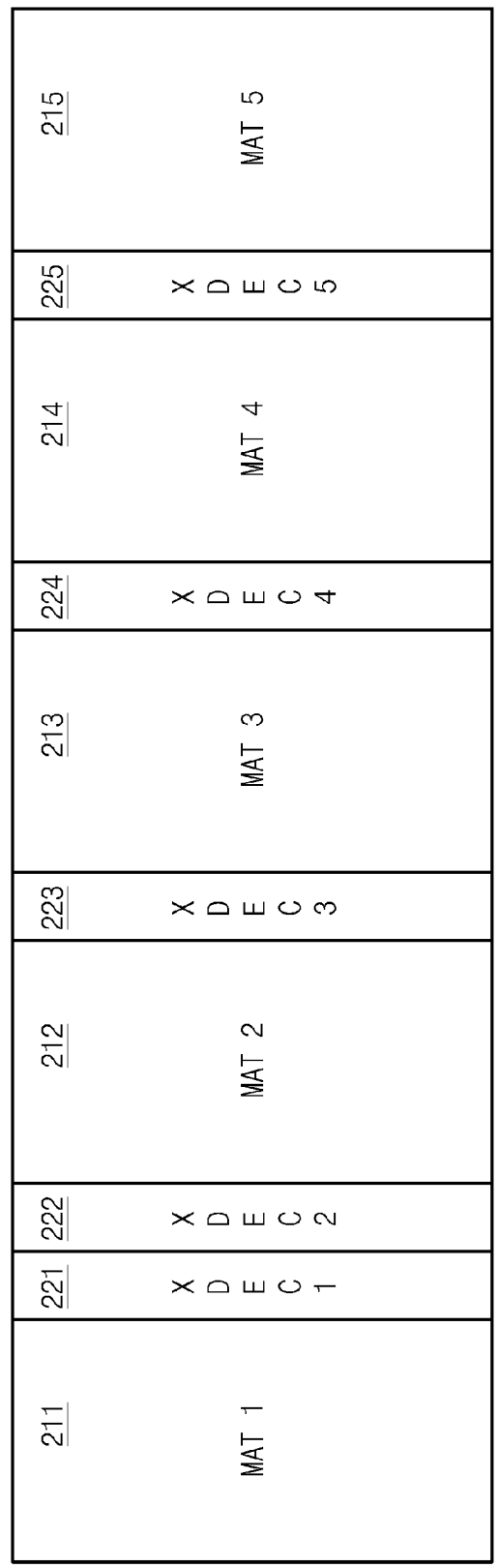
FIGS. 16 through 24 are diagrams illustrating various example arrangements of address decoders shown in FIG. 15.

In the example of FIG. 16, first address decoder 221 is disposed at the right side of first mat 211, second address decoder 222 is disposed between first address decoder 221 and second mat 212, third address decoder 223 is disposed between second mat 212 and third mat 213, fourth address decoder 224 is disposed between third mat 213 and fourth mat 214, and fifth address decoder 225 is disposed at the left side of fifth mat 215.

Figure 17:
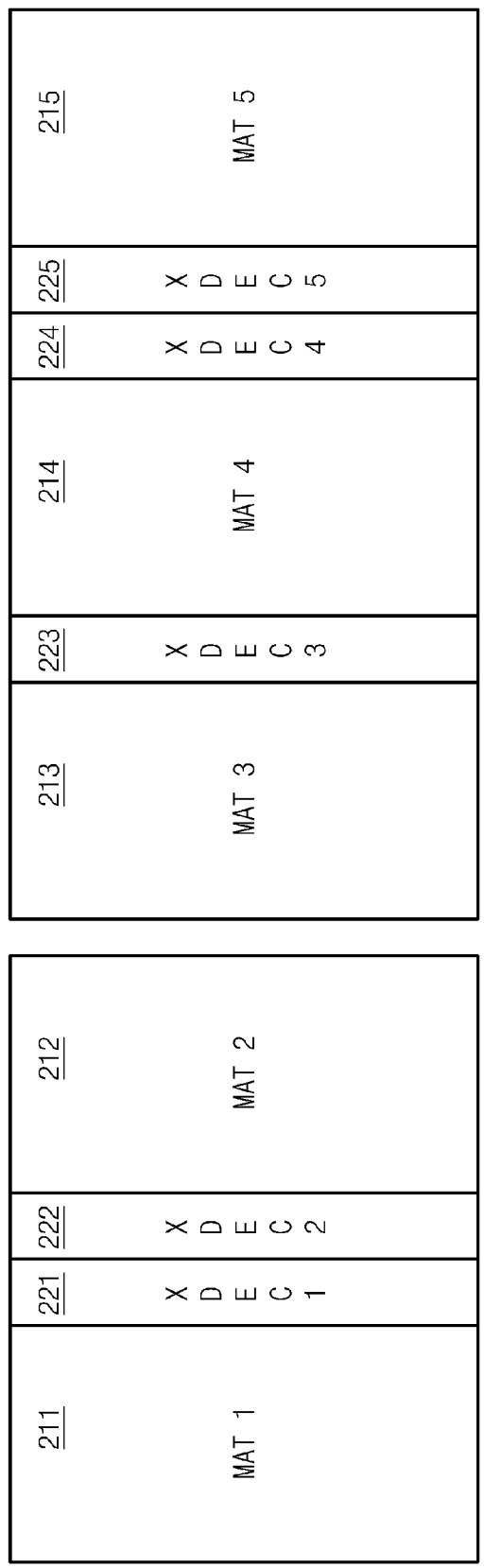

In the example of FIG. 17, first address decoder 221 is disposed at the right side of first mat 211, second address decoder 222 is disposed between first address decoder 221 and second mat 212, third address decoder 223 is disposed between third mat 213 and fourth mat 214, fourth address decoder 224 is disposed at the right side of fourth mat 214, and fifth address decoder 225 is disposed between fourth address decoder 224 and fifth mat 215.

Figure 18:
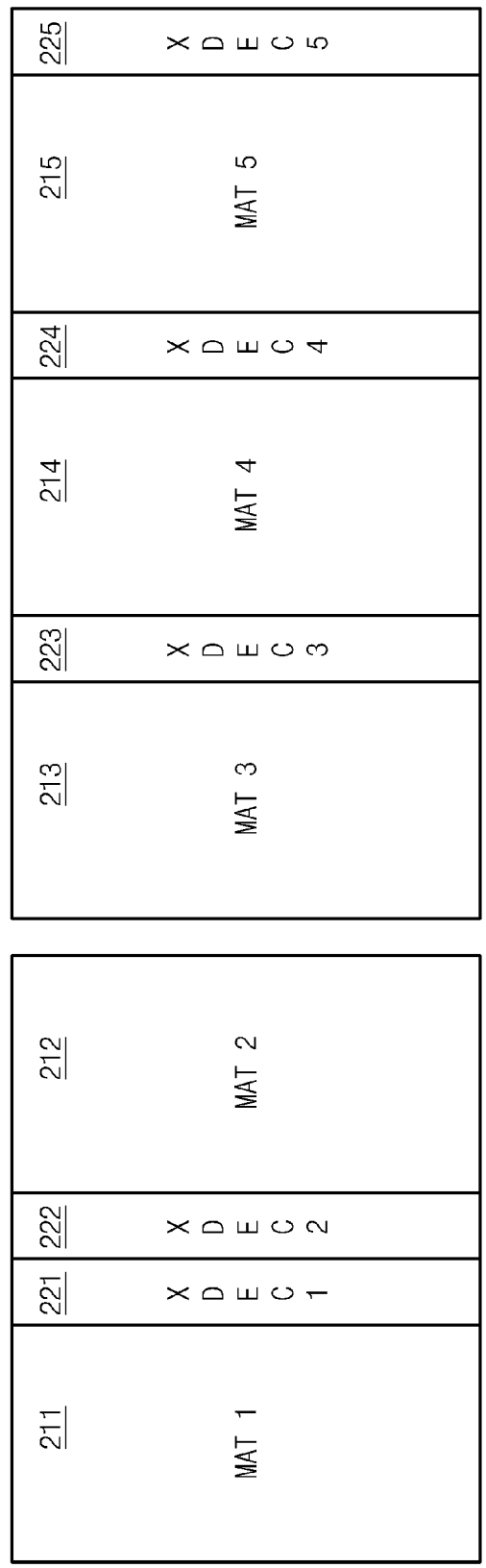

In the example of FIG. 18, first address decoder 221 is disposed at the right side of first mat 211, second address decoder 222 is disposed between first address decoder 221 and second mat 212, third address decoder 223 is disposed between third mat 213 and fourth mat 214, fourth address decoder 224 is disposed between fourth mat 214 and fifth mat 215, and fifth address decoder 225 is disposed at the right side of fifth mat 215.

Figure 19:
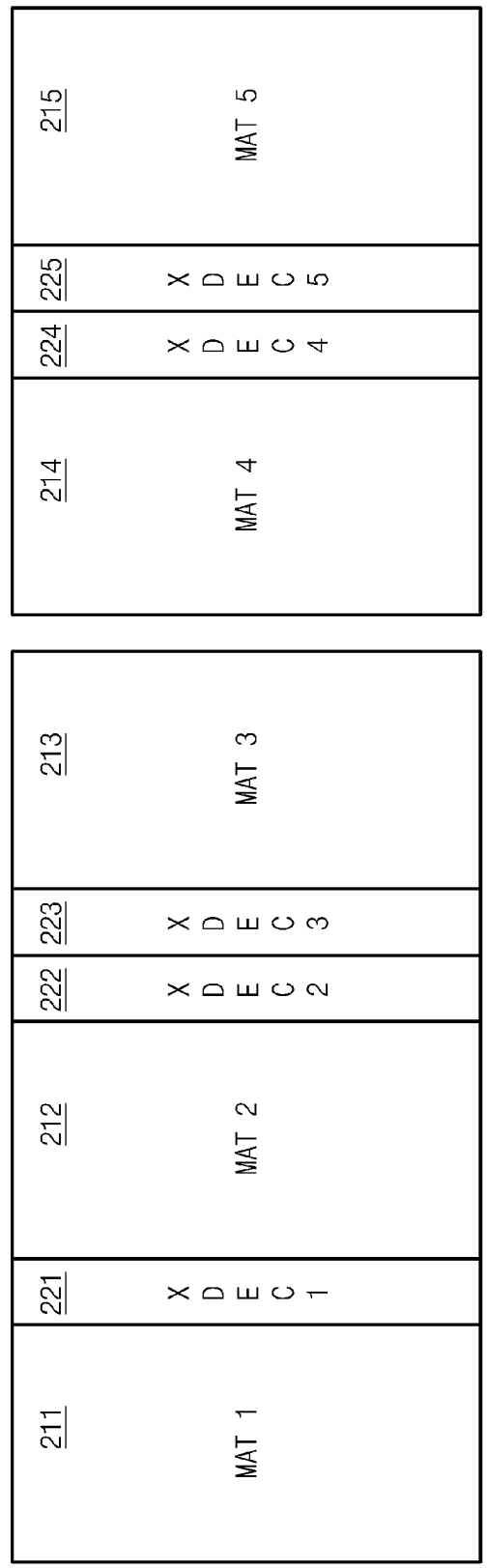

In the example of FIG. 19 first address decoder 221 is disposed between first mat 211 and second mat 212, second address decoder 222 is disposed at the right side of second mat 212, third address decoder 223 is disposed between second address decoder 222 and third mat 213, fourth address decoder 224 is disposed at the right side of fourth mat 214, and fifth address decoder 225 is disposed between fourth address decoder 224 and fifth mat 215.

Figure 20:
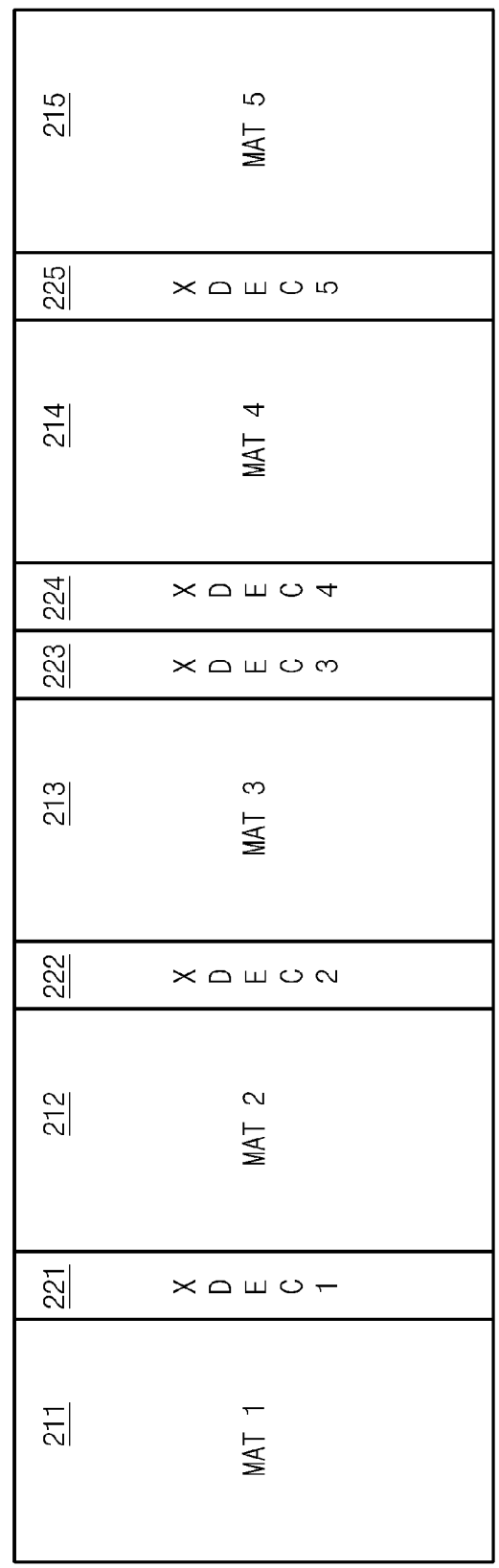

In the example of FIG. 20, first address decoder 221 is disposed between first mat 211 and second mat 212, second address decoder 222 is disposed between second mat 212 and third mat 213, third address decoder 223 is disposed at the right side of third mat 213, fourth address decoder 224 is disposed between third address decoder 223 and fourth mat 214, and fifth address decoder 225 is disposed between fourth mat 214 and fifth mat 215.

Figure 21:
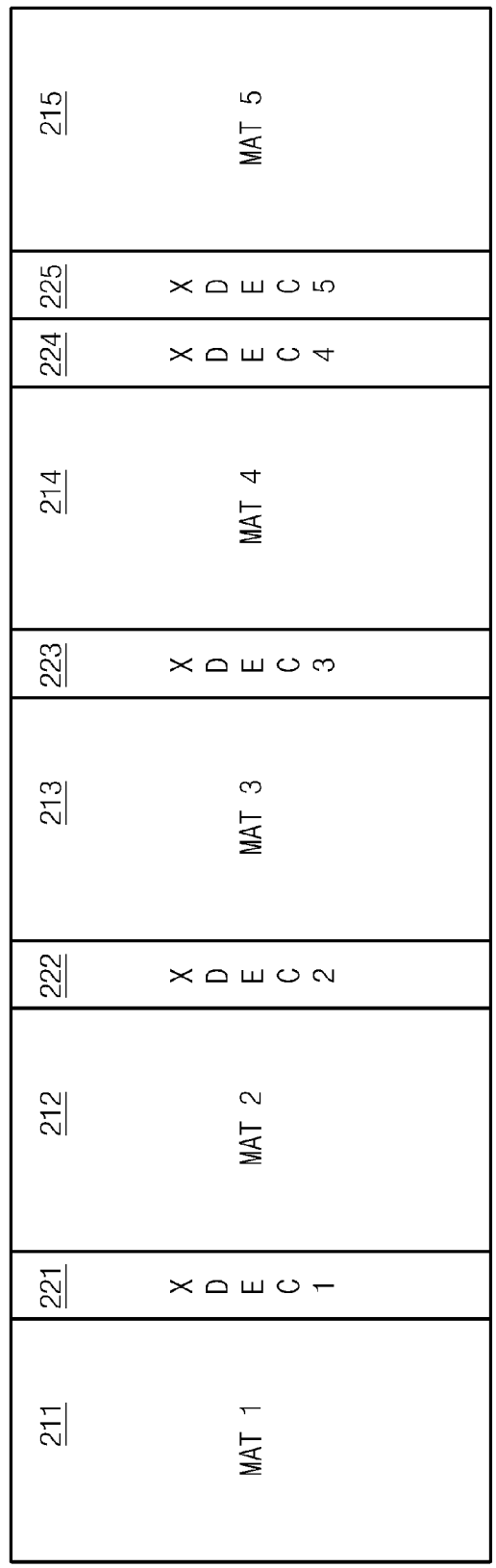

In the example of FIG. 21, first address decoder 221 is disposed between first mat 211 and second mat 212, second address decoder 222 is disposed between second mat 212 and third mat 213, third address decoder 223 is disposed between third mat 213 and fourth mat 214, fourth address decoder 224 is disposed at the right side of fourth mat 214, and fifth address decoder 225 is disposed between fourth address decoder 224 and fifth mat 215.

Figure 22:
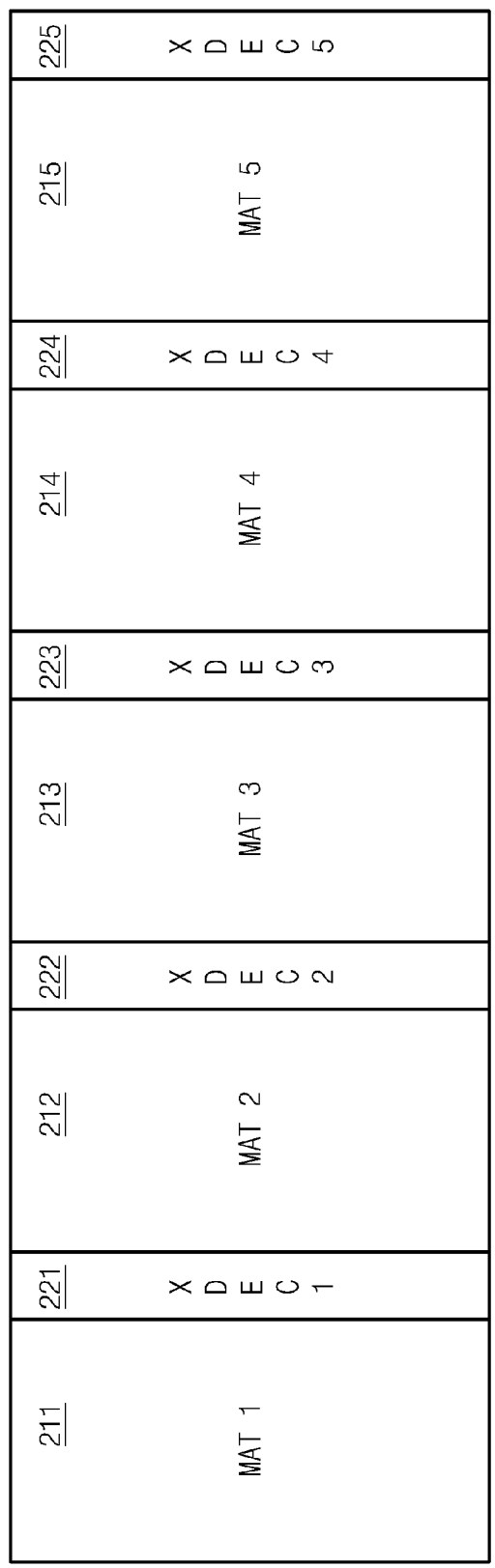

In the example of FIG. 22, first address decoder 221 is disposed between first mat 211 and second mat 212, second address decoder 222 is disposed between second mat 212 and third mat 213, third address decoder 223 is disposed between third mat 213 and fourth mat 214, fourth address decoder 224 is disposed between fourth mat 214 and fifth mat 215, and fifth address decoder 225 is disposed at the right side of fifth mat 215.

Figure 23:

In the example of FIG. 23, first address decoder 221 is disposed between first mat 211 and second mat 212, second address decoder 222 is disposed between second mat 212 and third mat 213, third address decoder 223 is disposed at the right side of third mat 213, fourth address decoder 224 is disposed between third address decoder 223 and fourth mat 214, and fifth address decoder 225 is disposed between fourth mat 214 and fifth mat 215.

Figure 24:
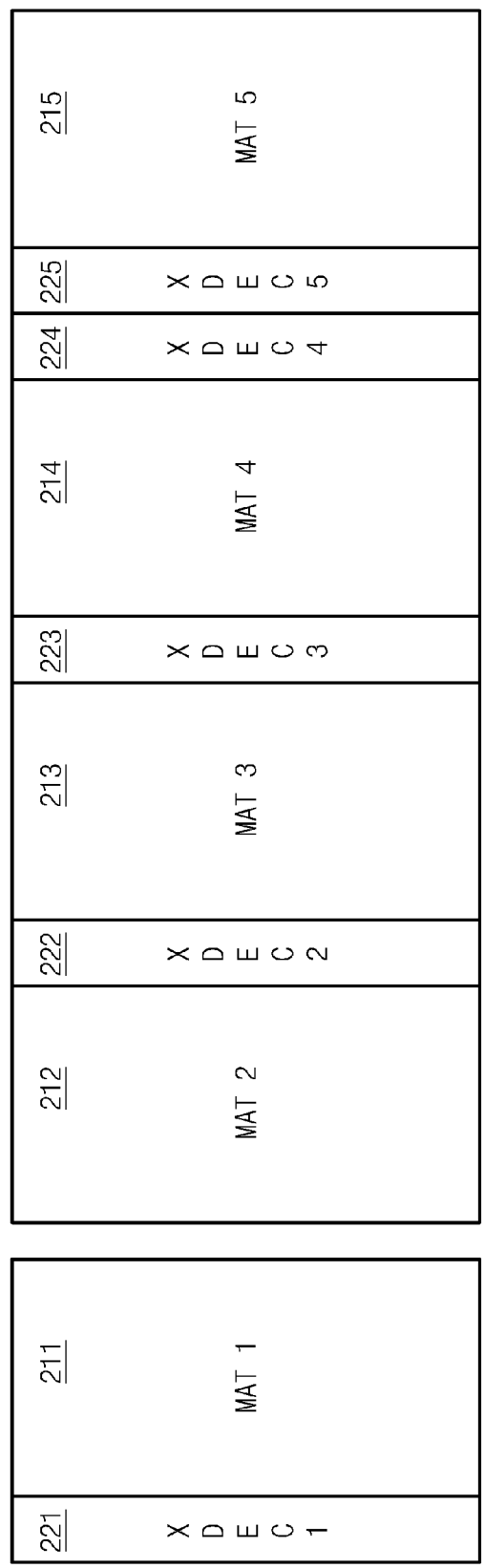

In the example of FIG. 24, first address decoder 221 is disposed at the left side of first mat 211, second address decoder 222 is disposed between second mat 212 and third mat 213, third address decoder 223 is disposed between third mat 213 and fourth mat 214, fourth address decoder 224 is disposed at the right side of fourth mat 214, and fifth address decoder 225 is disposed between fourth address decoder 224 and fifth mat 215.

Various example arrangements of address decoders 221 through 225 have been described with reference to FIGS. 16 through 24, but embodiments of the inventive concept are not limited to these examples, and address decoders 221 through 225 can be arranged in other ways.

Figure 25:
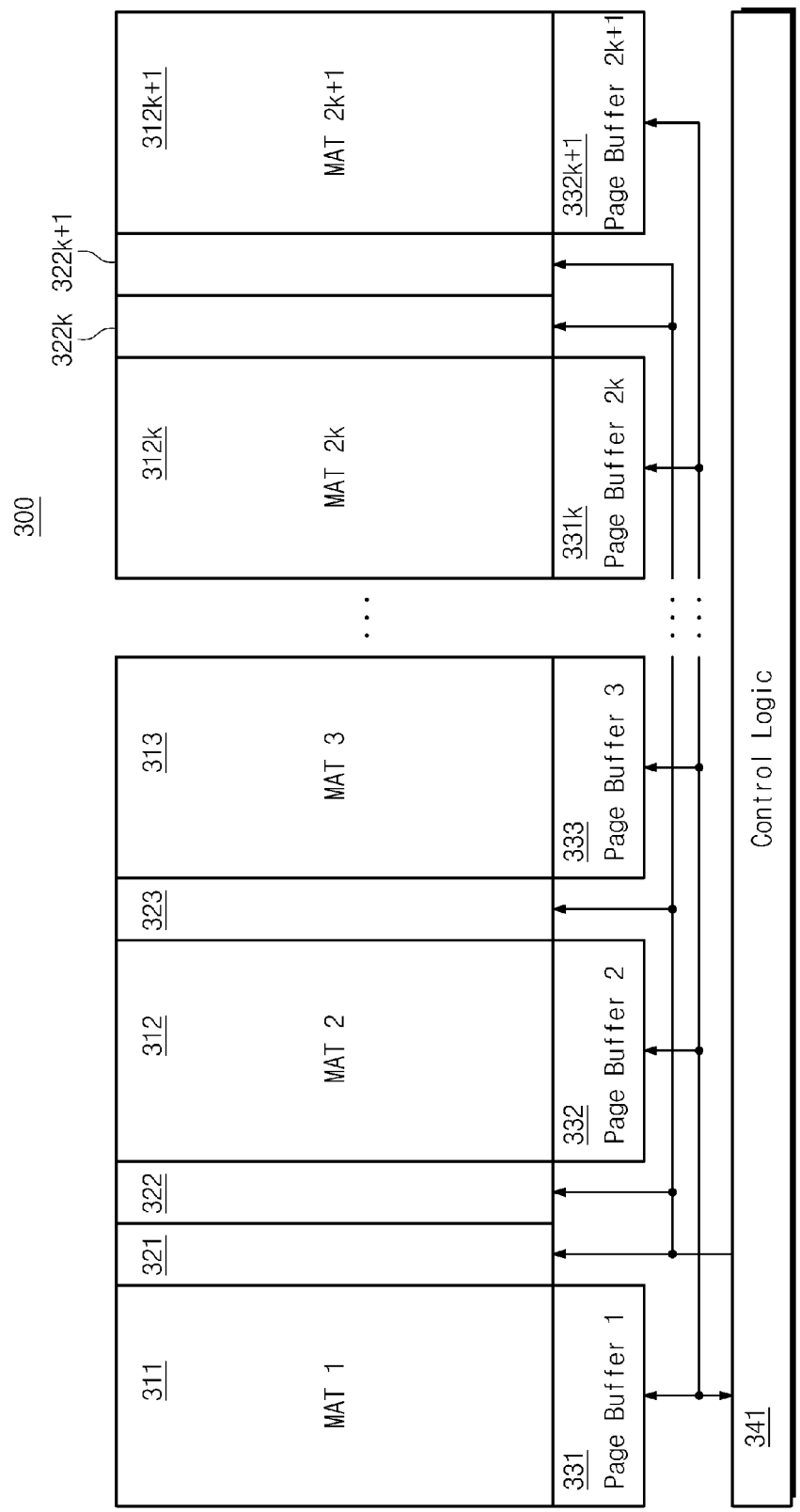
FIG. 25 is a diagram illustrating a nonvolatile memory device according to an embodiment of the inventive concept.

FIG. 25 is a diagram illustrating a nonvolatile memory device 300 according to an embodiment of the inventive concept. Referring to FIG. 25, nonvolatile memory device 300 comprises 2k+1 mats 311 through 312k+1, 2k+1 address decoders 321 through 322k+1, 2k+1 page buffers 331 through 332k+1, and control logic 341, where k is an integer greater than or equal to 3. At least one of mats 311 to 312k+1 comprises both even blocks and odd blocks.

In nonvolatile memory devices 100, 200, and 300 shown in FIGS. 1 through 25, memory block addresses can be fixed in hardware, or they can be modifiable under the control of a device such as a memory controller. Accordingly, the designation of even blocks and odd blocks can be configurable.

Figure 26:
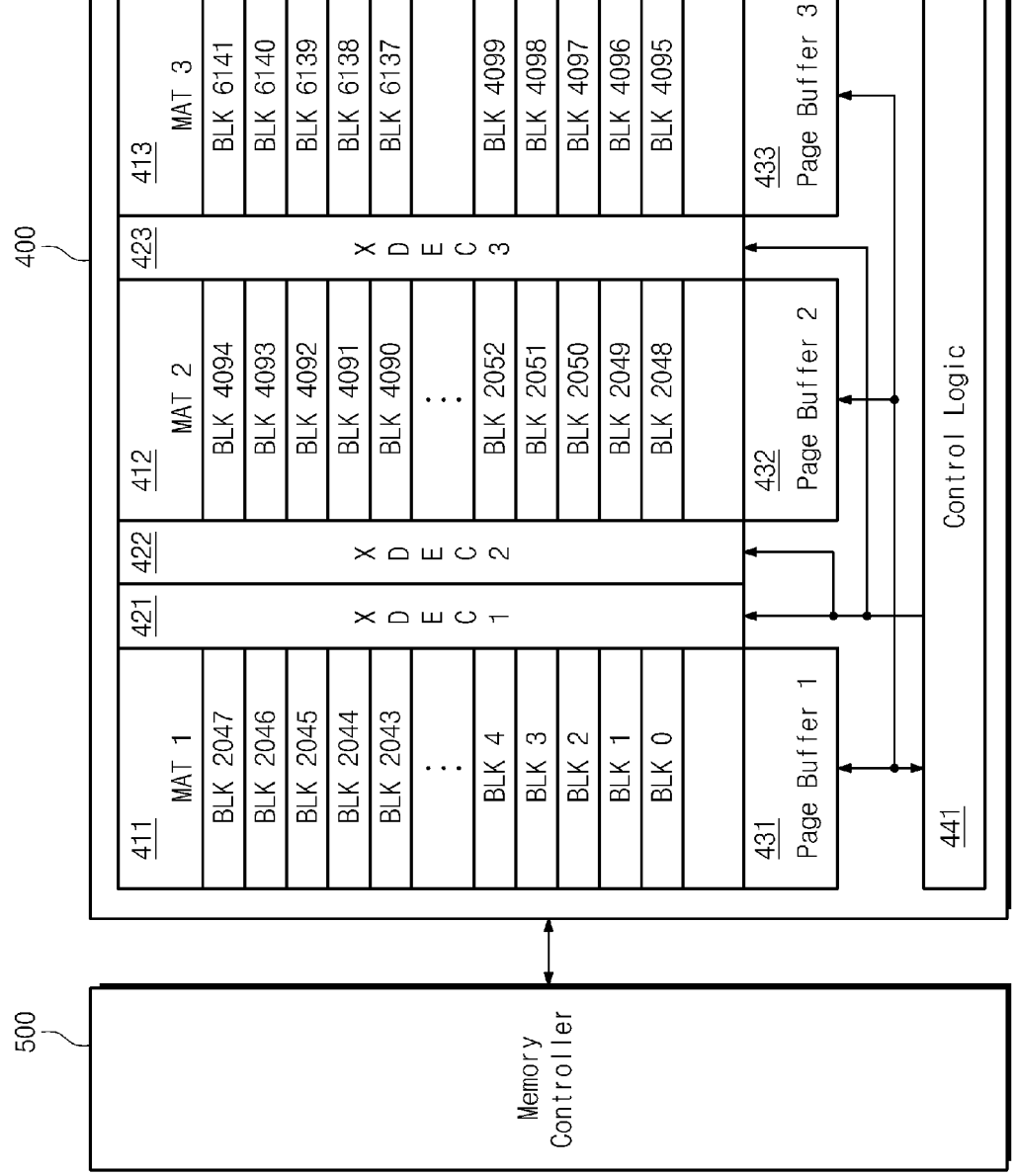
FIG. 26 is a diagram illustrating examples of memory block addresses in a memory system according to an embodiment of the inventive concept.

FIG. 26 is a diagram illustrating examples of memory block addresses in a memory system according to an embodiment of the inventive concept.

Referring to FIG. 26, the memory system comprises a memory controller 500 and a nonvolatile memory device 400. Nonvolatile memory device 400 comprises first through third mats 411, 412 and 413 each comprising both odd blocks and even blocks.

First mat 411 comprises first through 2047-th memory blocks BLK0 through BLK2047, second mat 412 comprises 2048-th through 4094-th memory blocks BLK2048 through BLK4094, and third mat 413 comprises 4095-th through 6,141-th memory blocks BLK4095 through BLK6141.

In some embodiments, memory controller 500 assigns the block addresses to mats 411, 412, and 413. These assignments can be performed in a variety of ways. For instance, memory controller 500 can number the memory blocks such that a memory block can be selected from each of mats 411, 412, and 413 based on a single input address as described with reference to FIG. 1.

In the example of FIG. 26, memory controller 500 assigns addresses so that each of mats 411, 412, and 413 contains both even and odd blocks. However, in other embodiments, memory controller 500 can assign addresses so that not all of mats 411, 412, and 413 include both even and odd blocks.

In the example of FIG. 26, nonvolatile memory device 400 comprises three mats 411, 412, and 413. However, in other embodiments, nonvolatile memory device 400 can have an odd number of mats greater than three.

Figure 27:
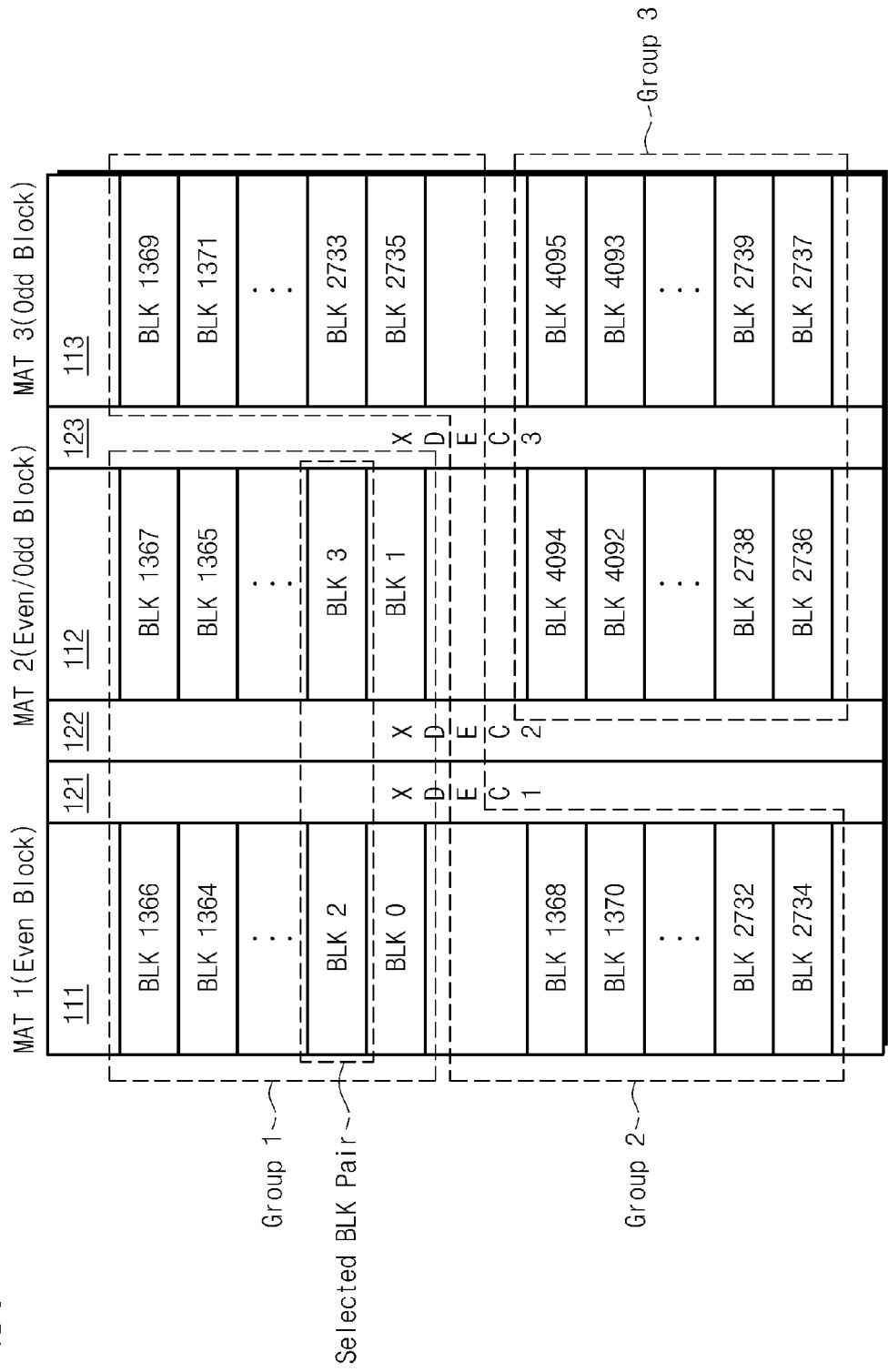
FIG. 27 is a diagram illustrating groups of memory blocks that are selected concurrently in a two-block access operation using a memory block address configuration shown in FIG. 5.

FIG. 27 is a diagram illustrating groups of memory blocks that are selected concurrently in a two-block access operation using the memory block address configuration shown in FIG. 5. Referring to FIG. 27, first through third groups Group1, Group2, and Group3 comprise memory blocks that are selected concurrently according to an input address in which the least significant bit is ignored.

First group Group1 comprises even blocks BLK0, BLK2, . . . , BLK1366 of first mat 111 and odd blocks BLK1, BLK3, . . . , BLK1367 of second mat 112. Second group Group2 comprises even blocks BLK1368, BLK1370, . . . , BLK2734 of first mat 111 and odd blocks BLK1369, BLK1371, . . . , BLK2735 of third mat 113. Third group Group3 comprises even blocks BLK2736, BLK 2738, . . . , BLK4094 of second mat 112 and odd blocks BLK2737, BLK2739, . . . , BLK4095 of third mat 113.

First through third groups Group1, Group2, and Group3 comprise the same number of even blocks and odd blocks, and comprise memory blocks covering a range of consecutively numbered addresses. For example, first group Group1 comprises memory blocks BLK0 through BLK1367, second group Group2 comprises memory blocks BLK1368 through BLK2735, and third group Group3 comprises memory blocks BLK2736 through BLK4095.

During the two-block access operation, one pair of blocks is selected from groups Group1, Group2, and Group3 according to the input address in which the least significant bit is ignored. For example, as indicated by a dashed rectangle in FIG. 27, blocks BLK2 and BLK3 are selected according to an input address in which the least significant bit is ignored.

Figure 28:
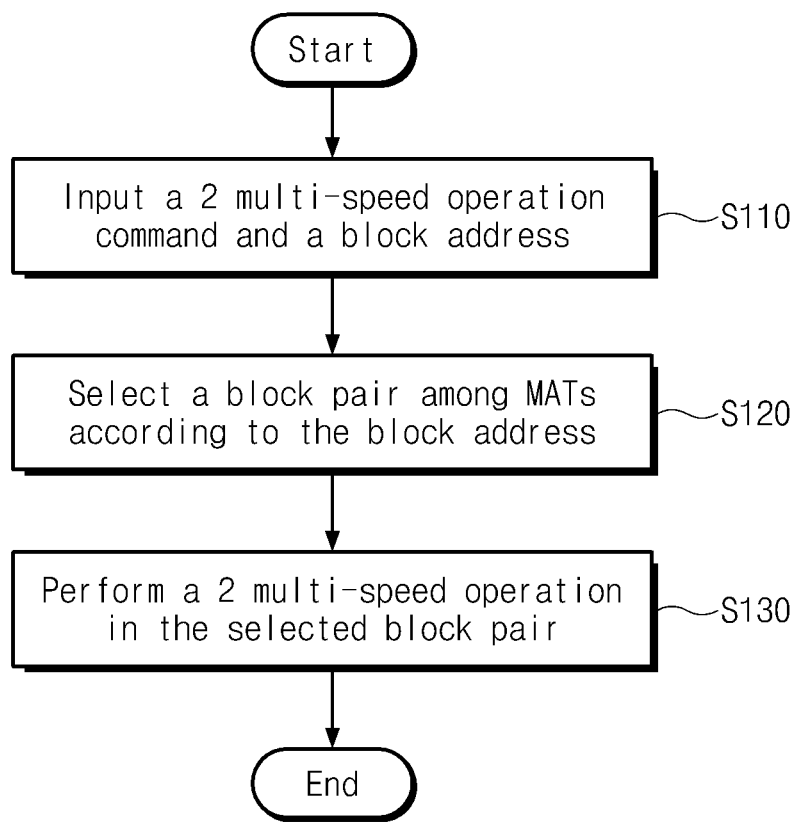
FIG. 28 is a flowchart illustrating a two-block access operation of a nonvolatile memory device according to an embodiment of the inventive concept.

FIG. 28 is a flowchart illustrating a two-block access operation of a nonvolatile memory device according to an embodiment of the inventive concept. The two-block access operation of FIG. 28 will be described with reference to FIGS. 27 and 28. In the description that follows, example method steps are indicated by parentheses.

In the method of FIG. 28, a two-block access operation command and a block address are input to nonvolatile memory device 100 (S110). Then, address decoders 121, 122, and 123 select a pair of memory blocks included in one of groups Group1, Group2, and Group3 according to the block address (S120). The selected block pair comprises two memory blocks included in different mats. Next, control logic 141 performs a two-block access operation on the selected pair of memory blocks (S130).

FIG. 29 is a diagram illustrating groups of memory blocks that are selected concurrently in a three-block access operation using the memory block address configuration shown in FIG. 5.

Referring to FIG. 29, three memory blocks are selected concurrently from three different mats according to an input address. In particular, a memory block BLK2 and a memory block BLK3 are selected according to an input address in which the least significant bit is ignored, and a memory block BLK2733 is selected according to a value obtained by adding a certain value to the input address. The certain value can be determined by control logic 141.

Figure 30:
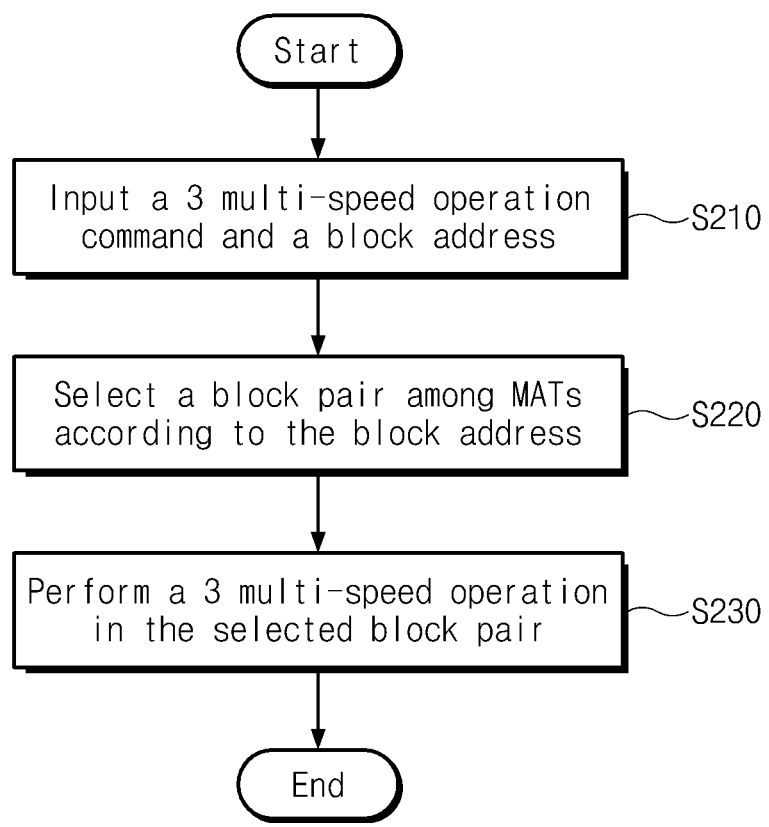
FIG. 30 is a flowchart illustrating a three-block access operation of a nonvolatile memory device according to an embodiment of the inventive concept.

FIG. 30 is a flowchart illustrating a three-block access operation of a nonvolatile memory device according to an embodiment. The two-block access operation of FIG. 30 will be described with reference to FIGS. 29 and 30.

Referring to FIG. 30, a three-block access operation command and a block address are input to nonvolatile memory device 100 (S210). Then, address decoders 121, 122, and 123 select a block group comprising memory blocks BLK2, BLK3, and BLK2733 according to the input block address (S220). Next, control logic 141 performs a three-block access operation on the selected block group (S230).

Figure 31:
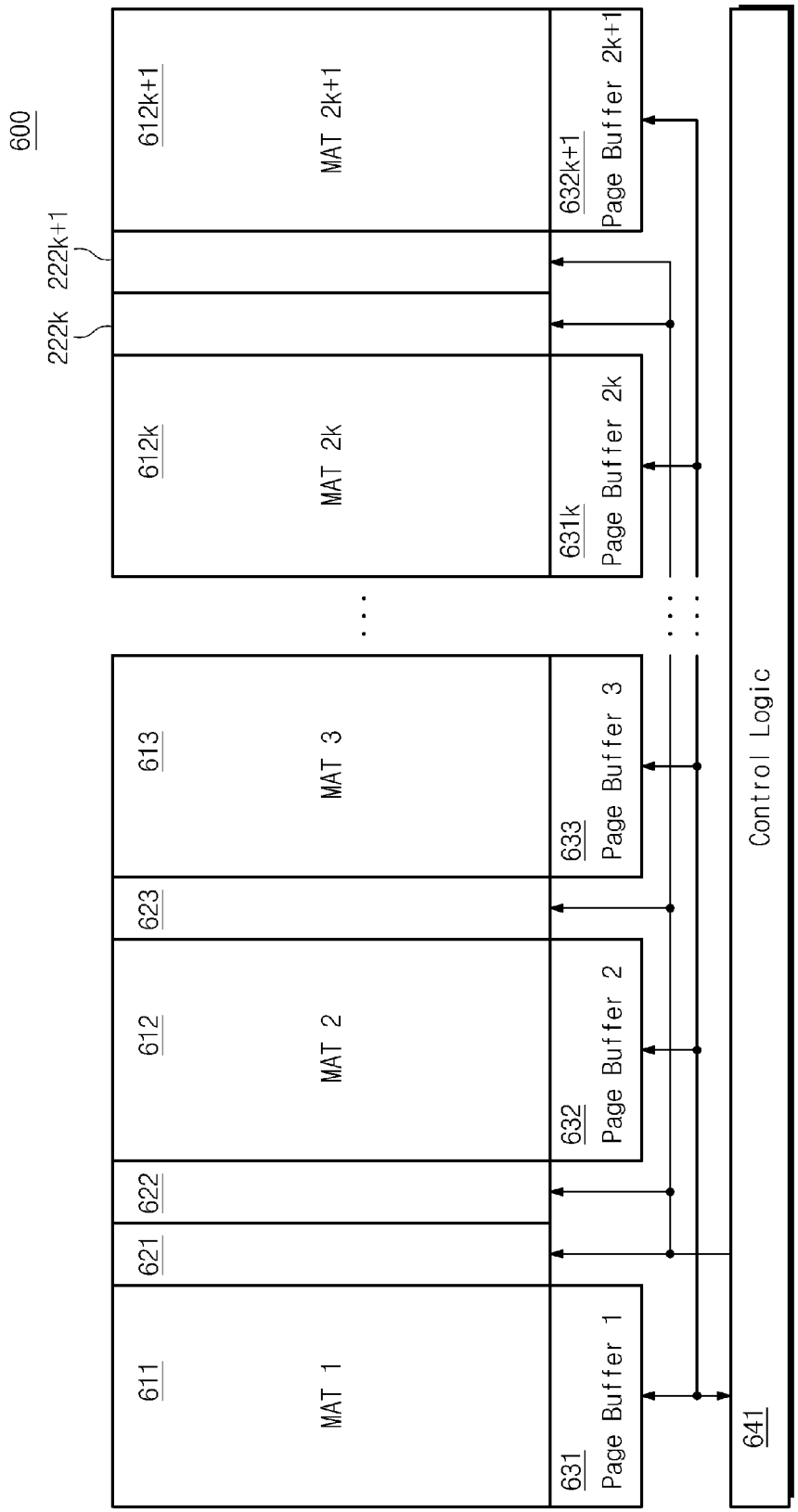
FIG. 31 is a diagram illustrating a nonvolatile memory device according to an embodiment of the inventive concept.

FIG. 31 is a diagram illustrating a nonvolatile memory device 600 according to an embodiment of the inventive concept. Nonvolatile memory device 600 comprises 2k+1 mats 611 through 612k+1, 2k+1 address decoders 621 through 622k+1, 2k+1 page buffers 631 through 632k+1, and control logic 641, where k is an integer greater than or equal to 2.

Nonvolatile memory device 600 comprises mats having only even memory blocks, mats having only odd memory blocks, and mats having both odd and even memory blocks. The address assignments of the memory blocks can be fixed in hardware or can be configurable by hardware or software. For instance, the address assignments could be configurable by a memory controller.

Figure 32:
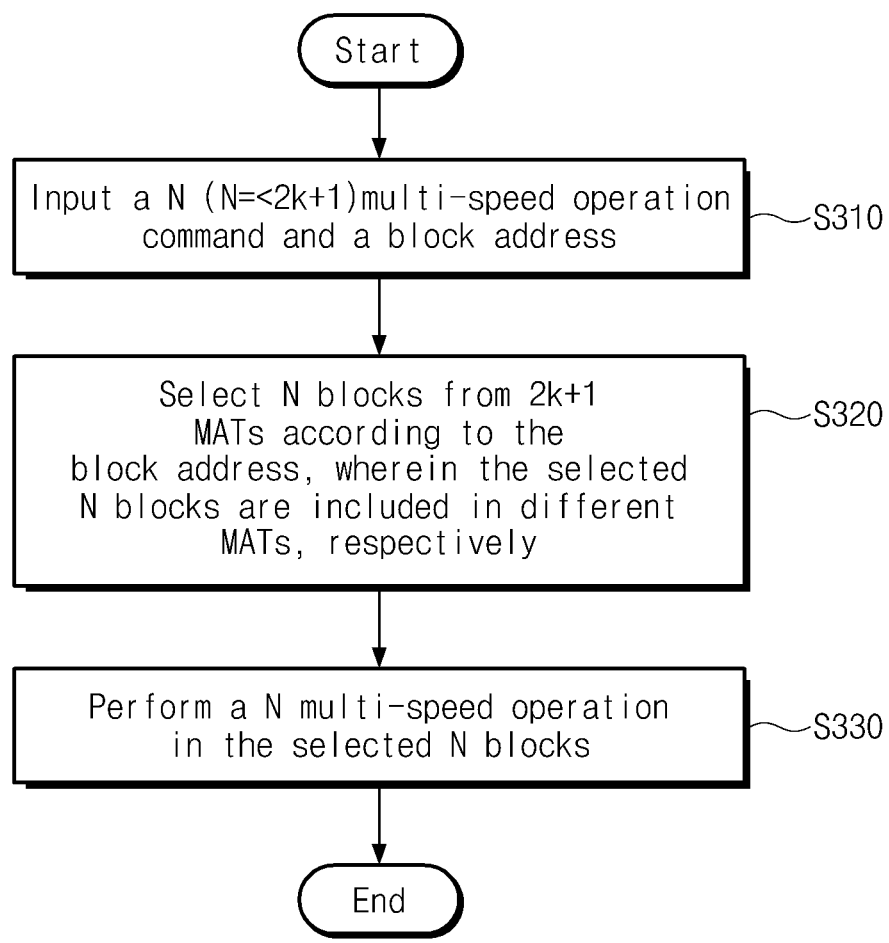
FIG. 32 is a diagram illustrating an N-block access operation of the nonvolatile memory device of FIG. 31.

FIG. 32 is a diagram illustrating an N-block access operation of nonvolatile memory device 600 of FIG. 31. In the example of FIG. 32, N is a natural number less than or equal to 2k+1, and k is a natural number greater than or equal to 1.

In the N-block access operation of FIG. 32, an N-block access operation command and a block address are input to nonvolatile memory device 600 (S310). Next, address decoders 621, 622, . . . , 622k+1 select N memory blocks according to the input block address (S320). The selected N memory blocks are included in different mats. Then, control logic 641 performs an N-block access operation on the selected N blocks (S330).

Figure 33:
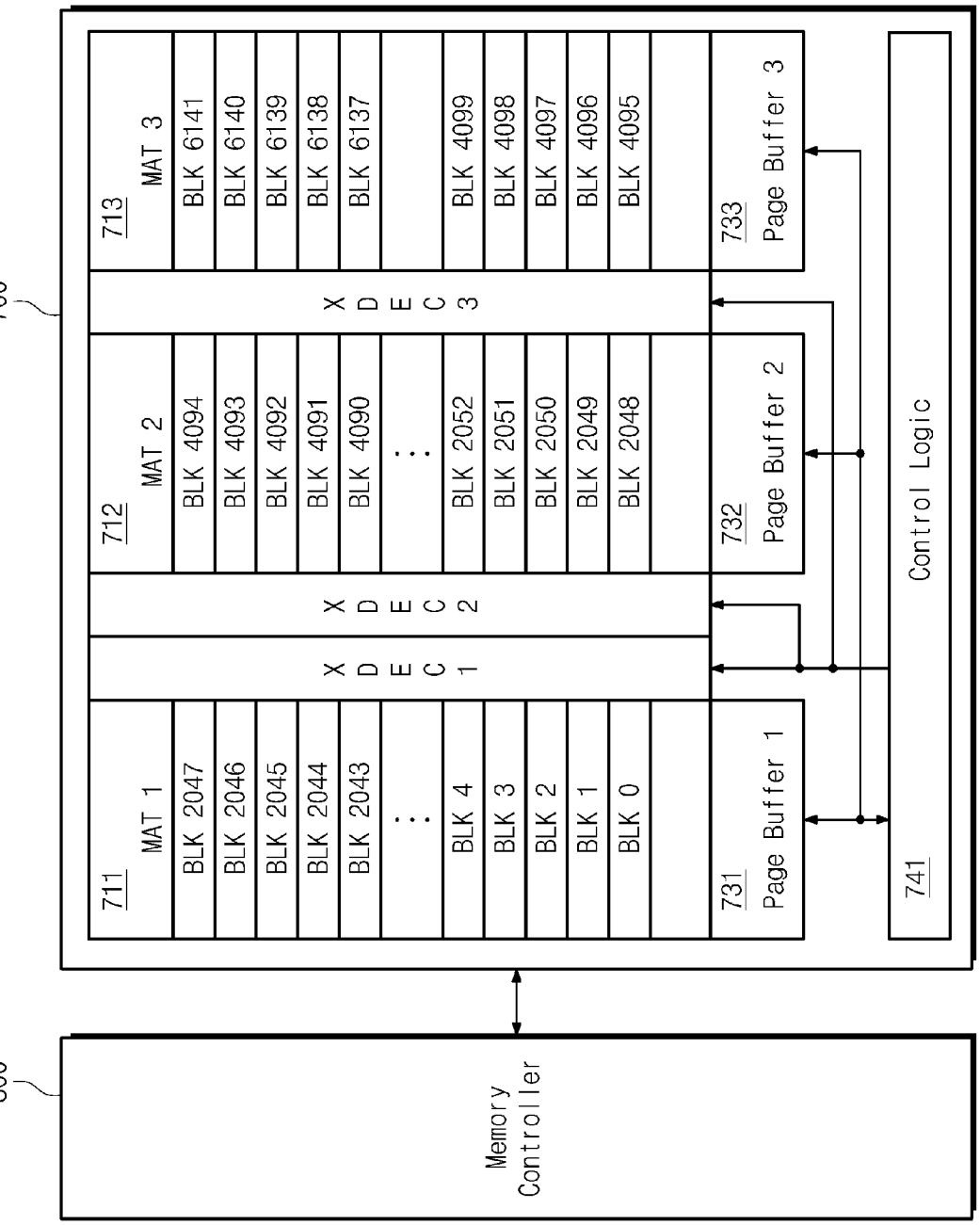
FIG. 33 is a diagram illustrating examples of memory block addresses in a memory system according to an embodiment of the inventive concept.

FIG. 33 is a diagram illustrating examples of memory block addresses in a memory system according to an embodiment of the inventive concept.

The memory system of FIG. 33 comprises a memory controller 800 and a nonvolatile memory device 700. Nonvolatile memory device 700 performs N-block access operations under the control of memory controller 800.

Nonvolatile memory device 700 comprises first through third mats 711, 712, and 713, first through third page buffers 731 through 733, and control logic 741. Each of first through third mats 711, 712, and 713 comprises even and odd memory blocks with consecutive addresses. In particular, first mat 711 comprises zero-th through 2047-th memory blocks BLK0 through BLK2047, second mat 712 comprises 2048-th through 4094-th blocks BLK2048 through BLK4094, and third mat 713 comprises 4095-th through 6141-th memory blocks BLK4095 through BLK6141.

The block address assignments of FIG. 33 are provided as examples, and first through third mats 711, 712, and 713 can be provided with various alternative block address assignments.

Memory controller 800 can number the memory blocks such that two or more memory blocks are not selected from one of mats 411, 412, and 413 according to an input address. Also, memory controller 800 can number the memory blocks such that one memory block is selected from each mat according to the input address.

In the example of FIG. 33, each of mats 711, 712, and 713 comprise both even and odd memory blocks. However, in alternative embodiments, memory controller 800 can make address assignments such that one or more of mats 711, 712, and 713 comprises only even memory blocks, or only odd memory blocks. Moreover, in the example of FIG. 33, nonvolatile memory device 700 comprises three mats 711, 712 and 713. However, in alternative embodiments, nonvolatile memory device 700 can be modified to have an odd number of mats greater than three.

Figure 34:
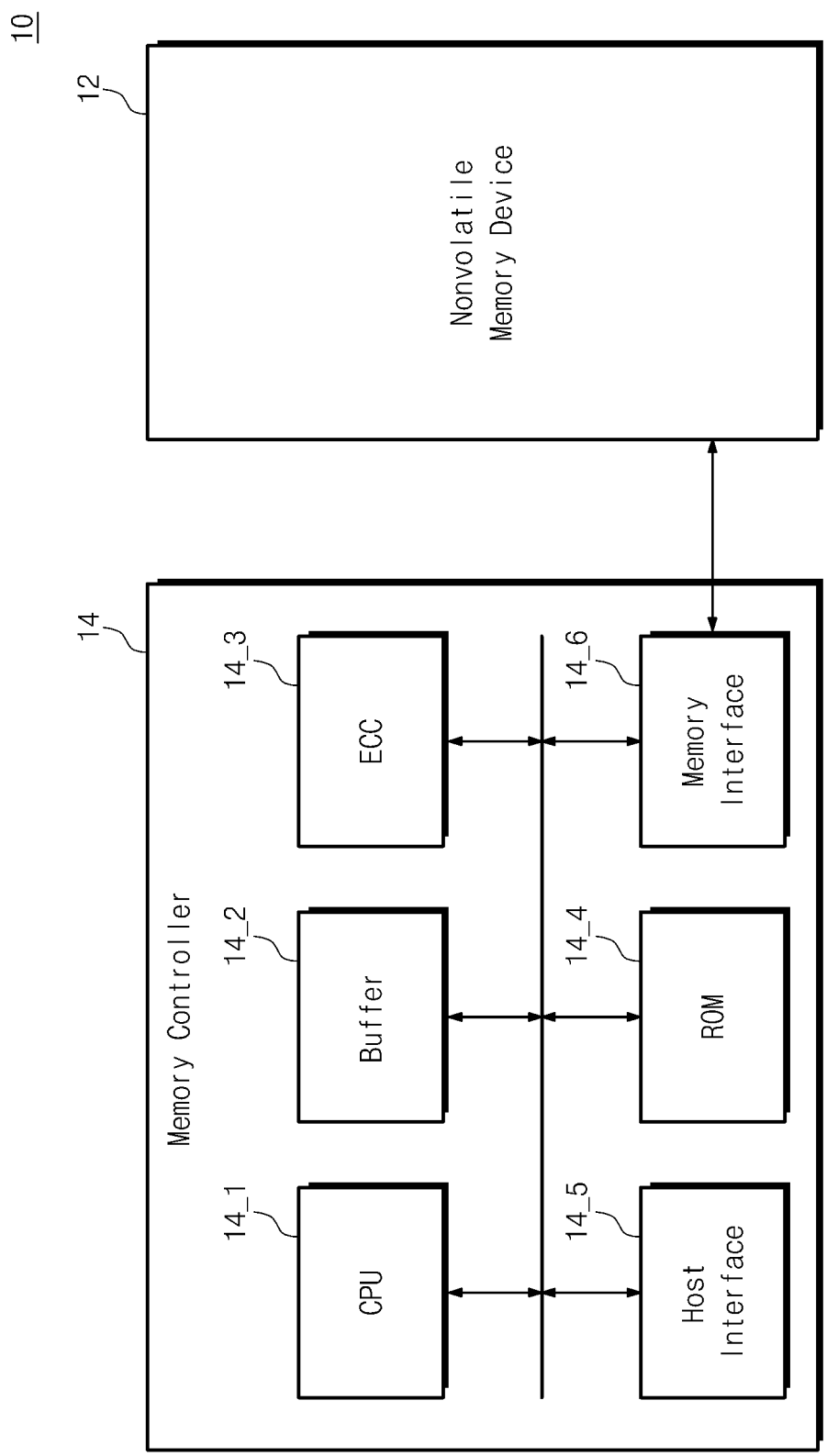
FIG. 34 is a diagram illustrating a memory system according to an embodiment of the inventive concept.

FIG. 34 is a diagram illustrating a memory system 10 according to an embodiment of the inventive concept.

Referring to FIG. 34, memory system 10 comprises a nonvolatile memory device 12 and a memory controller 14.

Nonvolatile memory device 12 can be implemented in the same manner as nonvolatile memory device 100 of FIG. 1, nonvolatile memory device 200 of FIG. 15, nonvolatile memory device 300 of FIG. 5, or nonvolatile memory device 600 of FIG. 31.

Memory controller 14 controls nonvolatile memory device 12 according to requests from an external device, such as a host. Memory controller 14 typically controls read, write, and erase operations of nonvolatile memory device 12.

Memory controller 14 provides an interface between nonvolatile memory device 12 and the host. Memory controller 14 typically drives firmware to control nonvolatile memory device 12. Memory controller 14 comprises a central processing unit (CPU) 14_1, a buffer 14_2, an error correction circuit (ECC) 14_3, a read-only memory (ROM) 14_4, a host interface 14_5, and a memory interface 14_6.

CPU 14_1 controls overall operations of memory controller 14.

Buffer 14_2 is used as a working memory of CPU 14_1. In response to a write request from the host, data received from the host is temporarily stored in buffer 14_2. In response to a read request from the host, data read from nonvolatile memory device 12 is temporarily stored in buffer 14_2.

In response to the write request, ECC 14_3 uses an error correction code to decode data stored in buffer 14_2. The decoded data and the error correction code are then stored in nonvolatile memory device 12. In response to the read request, ECC 14_3 uses an error correction code to restore data read from nonvolatile memory device 12. The error correction code value is typically included in the read data.

ROM 14_4 stores data used to drive memory controller 14.

Host interface 14_5 implements a protocol for data exchange between the host and memory controller 14. For example, memory controller 14 can be configured to communicate with the host using one of various interface protocols such as a universal serial bus (USB) protocol, a multimedia card (MMC) protocol, a peripheral component interconnection (PCI) protocol, a PCI-Express (PCI-E) protocol, an advanced technology attachment (ATA) protocol, a serial-ATA (SATA) protocol, a parallel-ATA (PATA) protocol, a small computer small interface (SCSI) protocol, an enhanced small disk interface (ESDI) protocol, or an integrated drive electronics (IDE) protocol.

Memory interface 14_6 provides an interface between nonvolatile memory device 12 and memory controller 14.

Memory system 10 comprises nonvolatile memory device 12 configured with three mats implemented with sub-30 nm process technology, thus providing expansive data storage capacity within a limited chip size.

Figure 35:
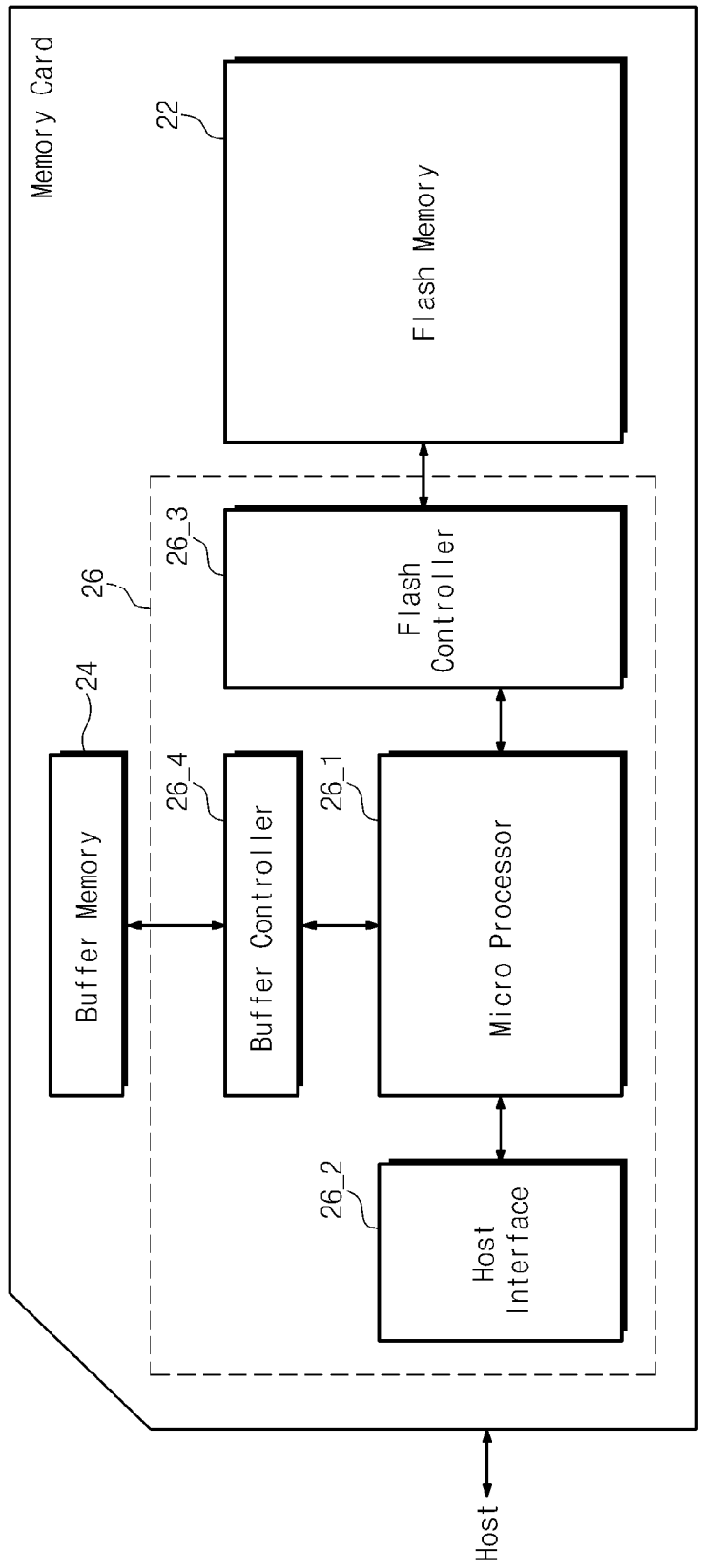
FIG. 35 is a diagram illustrating a memory card according to an embodiment of the inventive concept.

FIG. 35 is a block diagram of a memory card 20 according to an embodiment of the inventive concept.

Referring to FIG. 35, memory card 20 comprises a flash memory 22, a buffer memory 24, and a memory controller 26 for controlling flash memory 22 and buffer memory 24.

Flash memory 22 can be implemented in the same manner as nonvolatile memory device 100 of FIG. 1, nonvolatile memory device 200 of FIG. 15, nonvolatile memory device 300 of FIG. 5, or nonvolatile memory device 600 of FIG. 31.

Buffer memory 24 is used to temporarily store data generated during the operation of memory card 20. Buffer memory 24 typically comprises a DRAM or an SRAM.

Memory controller 26 is typically connected between a host and flash memory 22, and is configured to access flash memory 22 in response to requests from the host.

Memory controller 26 comprises a microprocessor 26_1, a host interface 26_2, a flash controller 26_3, and a buffer controller 26_4.

Memory controller 26 is configured to drive firmware for controlling flash memory 22. Host interface 26_2 interfaces with the host via a card protocol (e.g., MMC) to facilitate data exchange between the host and controllers 26_3 and 26_4.

Memory card 20 can comprise, for instance, a multimedia card (MMC), a secure digital (SD) card, a miniSD card, a memory stick, a smartmedia card, or a transflash card.

Flash memory 22 is configured with three mats implemented with sub-30 nm process technology, thus providing expansive data storage capacity within a limited chip size.

Figure 36:
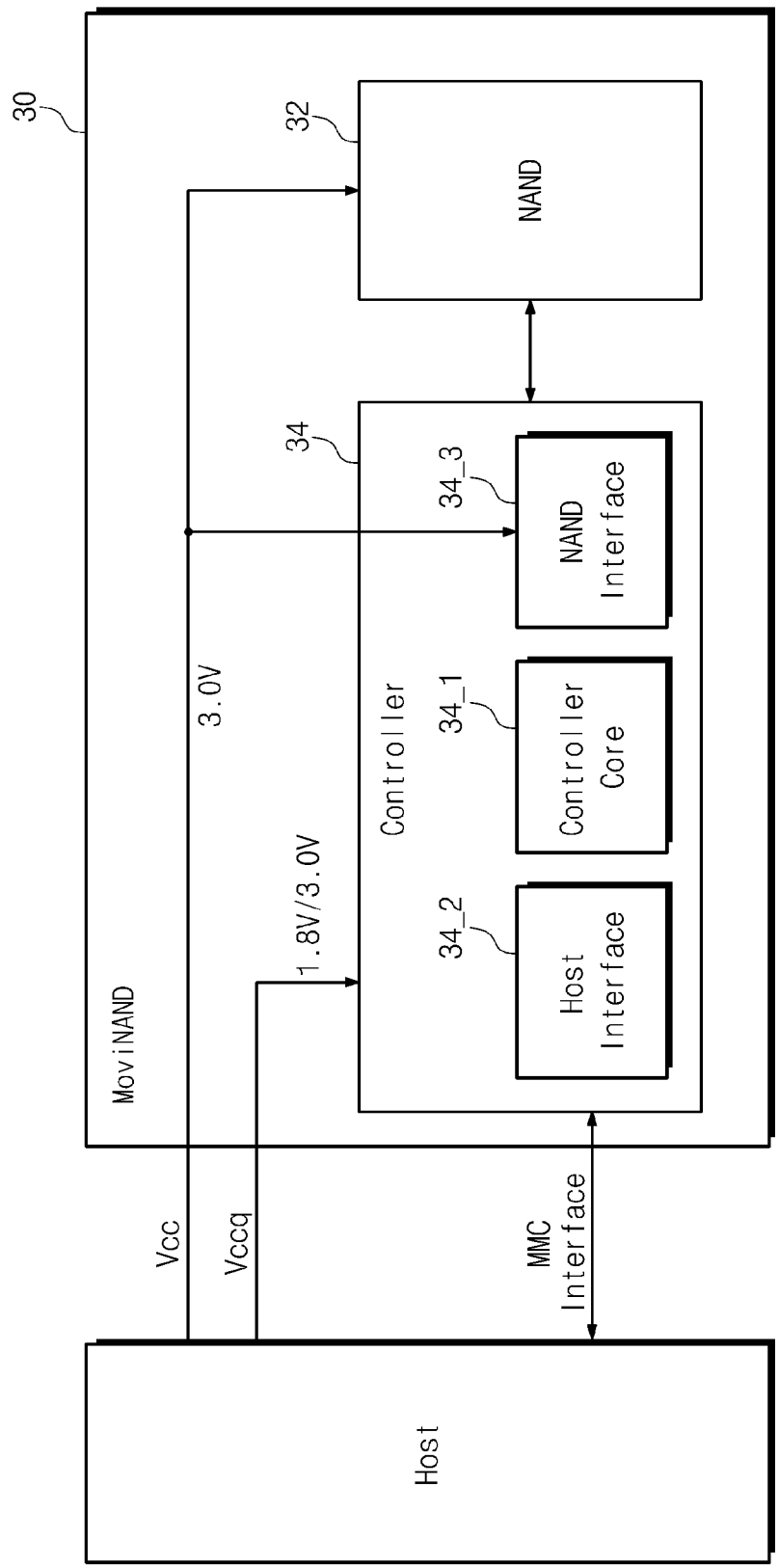
FIG. 36 is a diagram illustrating a moviNAND according to an embodiment of the inventive concept.

FIG. 36 is a block diagram of a moviNAND device 30 according to an embodiment of the inventive concept. Referring to FIG. 36, moviNAND device 30 comprises a NAND flash memory device 32 and a controller 34. NAND flash memory device 32 is configured using a stack of unitary NAND flash memories in a package, such as a fine-pitch ball grid array (FBGA). Each of the unitary NAND flash memories can be implemented in the same manner as nonvolatile memory device 100 of FIG. 1, nonvolatile memory device 200 of FIG. 15, nonvolatile memory device 300 of FIG. 25, or nonvolatile memory device 600 of FIG. 31

Controller 34 comprises a controller core 34_1, a host interface 34_2, and a NAND interface 34_3. Controller core 34_1 controls overall operations of moviNAND device 30. Host interface 34_2 is configured to interface between controller 34 and an MMC of a host. NAND interface 34_3 is configured to interface between NAND flash memory device 32 and controller 34.

MoviNAND device 30 receives power supply voltages Vcc and Vccq from the host. Power supply voltage Vcc (about 3V) is supplied to NAND flash memory device 32 and NAND interface 34_3, while power supply voltage Vccq (about 1.8V/3V) is supplied to controller 34.

MoviNAND device 30 comprises NAND flash memory device 32 configured with three mats implemented with sub-30 nm process technology, thus providing expansive data storage capacity within a limited chip size.

Figure 37:
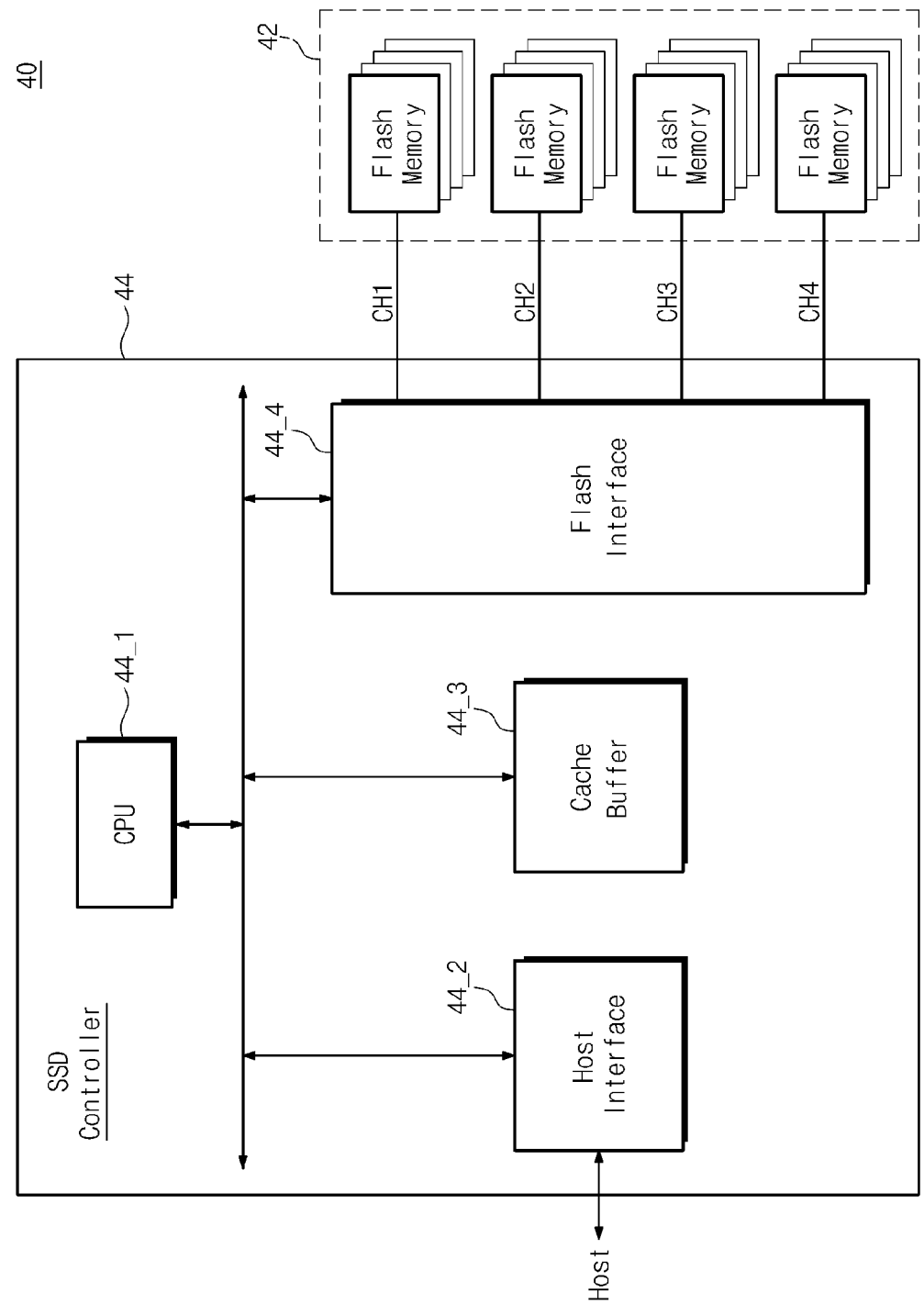
FIG. 37 is a diagram illustrating a solid state drive (SSD) according to an embodiment of the inventive concept.

FIG. 37 is a block diagram of an SSD 40 according to an embodiment of the inventive concept. Referring to FIG. 37, SSD 40 comprises a plurality of flash memory devices 42 and an SSD controller 44.

Each of flash memory devices 42 can be implemented in the same manner as nonvolatile memory device 100 of FIG. 1, nonvolatile memory device 200 of FIG. 15, nonvolatile memory device 300 of FIG. 25, or nonvolatile memory device 600 of FIG. 31.

SSD controller 44 comprises a CPU 44_1, a host interface 44_2, a cache buffer 44_3, and a flash interface 44_4.

Under the control of CPU 44_1, host interface 44_2 exchanges data with a host using an ATA protocol, such as SATA, PATA, or External SATA (ESATA).

Data to be received from or transmitted to the host through host interface 44_2 can be delivered to cache buffer 44_3 without passing through a CPU bus, under the control of CPU 44_1.

Cache buffer 44_3 temporarily stores data transferred between external devices and flash memory devices 42. Cache buffer 44_3 can also be used to store programs to be executed by CPU 44_1, and is typically implemented using an SRAM.

Flash interface 44_4 is configured to interface between SSD controller 44 and flash memory devices 42. Flash interface 44_4 can be configured to support NAND flash memories, One-NAND flash memories, multi-level flash memories, or single-level flash memories.

SSD 40 comprises flash memory devices 42 configured with three mats implemented with sub-30 nm process technology, thus providing expansive data storage capacity within a limited chip size.

Figure 38:
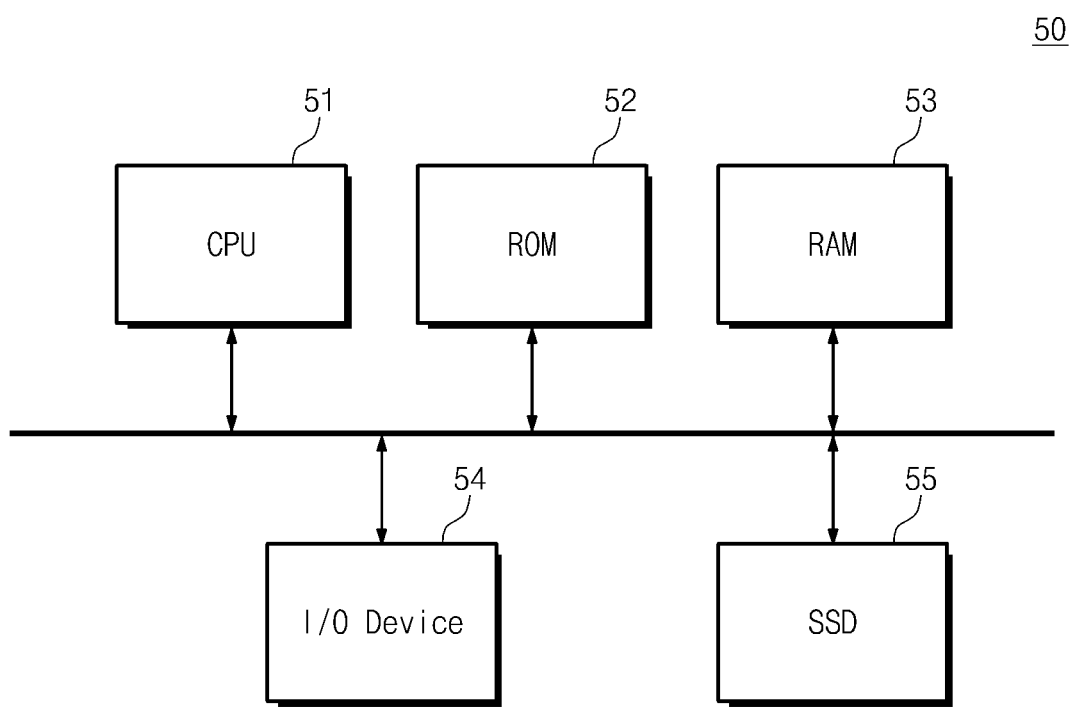
FIG. 38 is a diagram illustrating a computing system according to an embodiment of the inventive concept.

FIG. 38 is a block diagram of a computing system 50 according to an embodiment of the inventive concept. Referring to FIG. 38, computing system 50 comprises a CPU 51, a ROM 52, a RAM 53, an input/output (I/O) device 54, and an SSD 55.

CPU 51 is connected to a system bus. ROM 52 stores data used to drive computing system 50. The data in ROM 52 comprises a start command sequence or a basic I/O system (BIOS) sequence. RAM 53 temporarily stores data generated during the execution of CPU 51.

I/O device 54 is connected to the system bus through an I/O device interface. Examples of I/O device 54 include keyboards, pointing devices (e.g., mouse), monitors, and modems.

SSD 55 can be implemented in the same manner as SSD 40 of FIG. 37. SSD 55 can provide computing system 50 with large storage capacity in a package of limited size.

Figure 39:
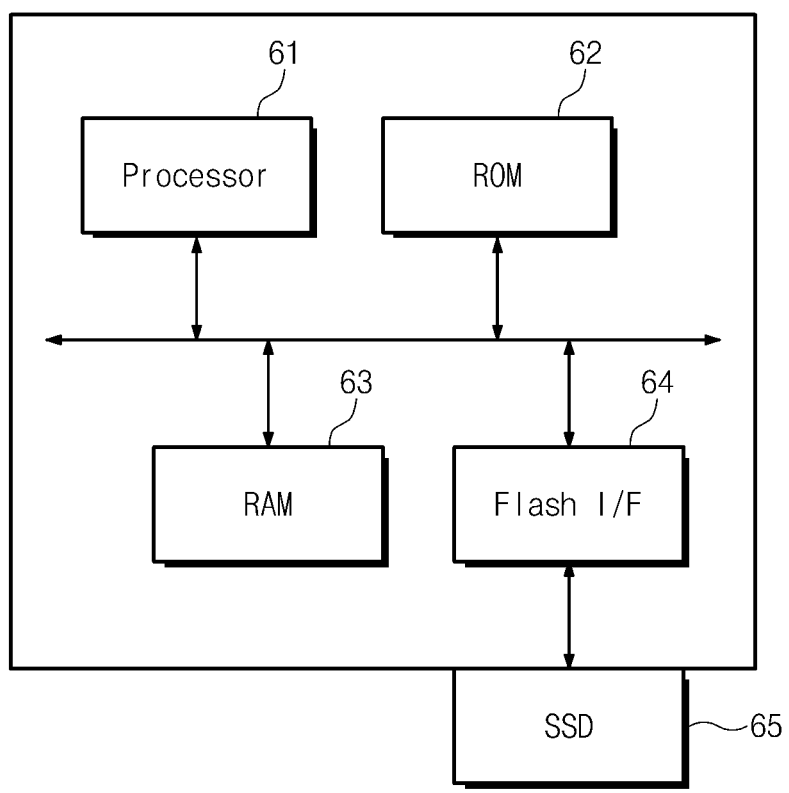
FIG. 39 is a diagram illustrating an electronic device according to an embodiment of the inventive concept.

FIG. 39 is a block diagram of an electronic device 60 according to an embodiment of the inventive concept. Referring to FIG. 39, electronic device 60 comprises a processor 61, a ROM 62, a RAM 63, a flash interface (I/F) 64, and an SSD 65.

Processor 61 accesses RAM 63 to execute firmware or other code. Processor 61 accesses ROM 62 to execute various command sequences such as a start command sequence and a BIOS sequence. Flash interface 64 is configured to interface between electronic device 60 and SSD 65.

SSD 65 can be detachable from electronic device 60 and can be implemented in the same manner as SSD 40 of FIG. 37. In addition, SSD 65 can provide electronic device 60 with large storage capacity in a package of limited size.

Examples of electronic device 60 include cellular phones, personal digital assistants (PDAs), digital cameras, camcorders, portable audio players (e.g., MP3), and portable media players (PMPs).

Figure 40:
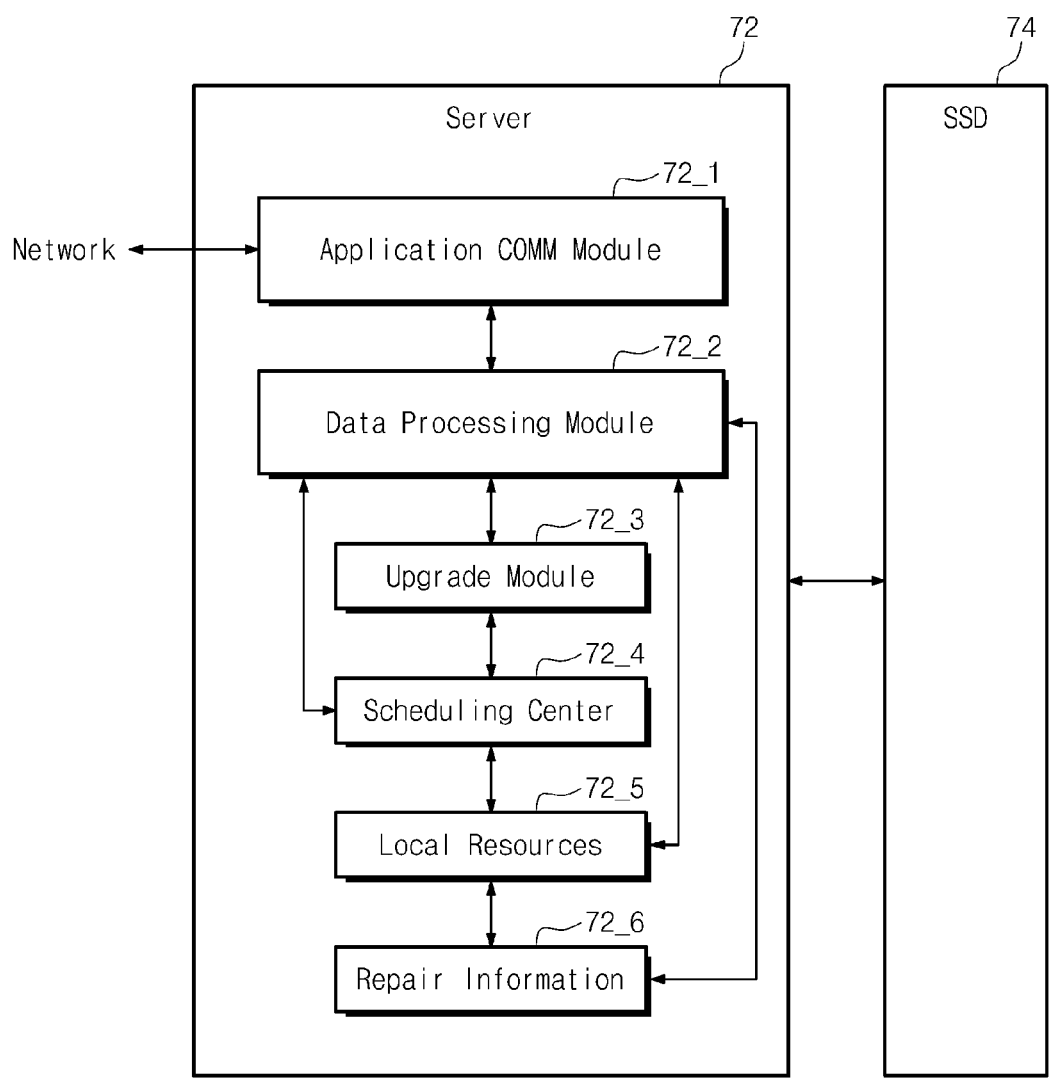
FIG. 40 is a diagram illustrating a server system according to an embodiment of the inventive concept.

FIG. 40 is a block diagram of a server system 70 according to an embodiment of the inventive concept. Referring to FIG. 40, server system 70 comprises a server 72 and an SSD 74 that stores data used to drive server 72. SSD 74 can be configured in the same manner as SSD 40 of FIG. 37.

Server 72 comprises an application communication module 72_1, a data processing module 72_2, an upgrade module 72_3, a scheduling center 72_4, a local resource module 72_5, and a repair information module 72_6.

Application communication module 72_1 can be configured to communicate with SSD 74, or with a computing system connected to a network. Application communication module 72_1 transmits data or information, provided through a user interface, to data processing module 72_2.

Data processing module 72_2 is linked to local resource module 72_5. Local resource module 72_5 can provide information to a user, such as a list of repair shops, dealers, or technical facts, on the basis of information or data input to server 72.

Upgrade module 72_3 interfaces with data processing module 72_2. Based on information or data received from SSD 74, upgrade module 72_3 performs upgrades to firmware, reset codes, diagnosis systems, or other information regarding electronic appliances.

Scheduling center 72_4 provides real-time options to the user based on the information or data input to server 72.

Repair information module 72_6 interfaces with data processing module 72_2. Repair information module 72_6 is be used to provide repair-related information, such as audio, video, or document files, to the user. Data processing module 72_2 packages information related to the information received from SSD 74. The packaged information is typically transmitted to SSD 74 or displayed to the user.

The above-described systems and devices can be mounted in various types of packages. Examples of such packages or package types include package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated Circuit (SOIC), shrink small outline package (SSOP), thin small outline package (TSOP), system in package (SIP), multi-chip package (MCP), wafer-level fabricated package (WFP), and wafer-level processed stack package (WSP).

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A nonvolatile memory device, comprising:
a first mat comprising first memory blocks each having an even address;
a second mat comprising second memory blocks each having an even address or an odd address;
a third mat comprising third memory blocks each having an odd address;
a first address decoder that selects one of the first memory blocks according to a first even address;
a second address decoder that selects one of the second memory blocks according to a second even address or a first odd address; and
a third address decoder that selects one of the third memory blocks according to a second odd address.

2. The nonvolatile memory device of claim 1, wherein the first, second, and third mats are formed in different wells.

3. The nonvolatile memory device of claim 1, wherein the first, second, and third mats share a plurality of bit lines and one well.

4. The nonvolatile memory device of claim 1, wherein the respective first, second, and third memory blocks comprise vertical-type NAND strings formed in stacked semiconductor layers.

5. The nonvolatile memory device of claim 1, wherein the first even address and the second odd address differ only in their respective least significant bits.

6. A method of performing a multi-block access operation in a nonvolatile memory device comprising M mats, where M is an odd integer greater than or equal to three, the method comprising:
receiving an N-block access command and at least one address, where N is an integer between two and M;
selecting N memory blocks from N mats according to the at least one address; and
performing an N-block access operation on the selected memory blocks.

7. The method of claim 6, wherein at least one of the M mats comprises one or more memory blocks having an even address and one or more memory blocks having an odd address.

8. The method of claim 7, wherein at least one of the M mats comprises only memory blocks having even addresses, and at least one of the M mats comprises only memory blocks having odd addresses.

9. The method of claim 6, wherein the at least one address comprises N memory block addresses.

10. The method of claim 6, wherein the at least one address comprises a single memory block address.

11. The method of claim 10, wherein at least two of the selected memory blocks are selected using memory block addresses obtained by increasing or decreasing the one memory block address.

12. The method of claim 10, wherein two of the selected memory blocks have memory block addresses that differ only in their respective least significant bits.

13. The method of claim 10, wherein at least one of the selected memory blocks is selected using a memory block address obtained by adding a predetermined value to the one memory block address.

14. A memory system comprising:
a nonvolatile memory device comprising:
M mats each comprising a plurality of memory blocks, where M is an odd integer greater than or equal to three; and
M address decoders each corresponding to a different one of the M mats and configured to select memory blocks from the corresponding mat according to an input address; and
a memory controller configured to control the nonvolatile memory device to perform an N-block access operation in which at least two memory blocks from different mats are simultaneously selected according to one input address, wherein N is an integer between two and M.

15. The memory system of claim 14, wherein, during the N-block access operation, the M address decoders receive the one input address to select N memory blocks from N different mats among the M mats.

16. The memory system of claim 15, wherein the nonvolatile memory device further comprises a control logic that controls the address decoders to select the N memory blocks during the N-block access operation.

17. The memory system of claim 14, wherein at least one of the M mats comprises one or more memory blocks having an even address and one or more memory blocks having an odd address.

18. The memory system of claim 14, wherein at least one of the M mats comprises only memory blocks having even addresses, and at least one of the M mats comprises only memory blocks having odd addresses.

19. The method of claim 14, wherein at least one of the M mats comprises only memory blocks having even addresses.

20. The memory system of claim 14, wherein M equals three, and the respective mats are formed using process technology of 30 nm or less.

* * * * *